US010863644B1

(12) United States Patent
Tseng et al.

(10) Patent No.: US 10,863,644 B1
(45) Date of Patent: Dec. 8, 2020

(54) DOUBLE-LAYER COMPUTE SLED AND CAM MOUNTING MECHANISM

(71) Applicant: DELL PRODUCTS, L.P., Round Rock, TX (US)

(72) Inventors: Chun-Yang Tseng, Taipei (TW); Chien Hung Chou, Taipei (TW); Rui-Shen Lu, Taipei (TW); Hsiang-Yin Hung, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/556,189

(22) Filed: Aug. 29, 2019

(51) Int. Cl.
*H05K 1/14* (2006.01)
*H05K 7/14* (2006.01)

(52) U.S. Cl.
CPC ......... *H05K 7/1487* (2013.01); *H05K 7/1489* (2013.01)

(58) Field of Classification Search
USPC ................................ 361/741, 759, 801, 803
See application file for complete search history.

(56) References Cited

U.S. PATENT DOCUMENTS

| 9,462,719 | B2 * | 10/2016 | Wu ..................... H05K 7/1409 |
| 9,674,978 | B2 * | 6/2017 | Wu ......................... G06F 1/185 |
| 10,146,271 | B1 | 12/2018 | Pav et al. |
| 10,251,300 | B1 * | 4/2019 | Mao ..................... H05K 7/1487 |
| 10,470,334 | B1 * | 11/2019 | Mao ..................... H05K 7/1487 |

\* cited by examiner

*Primary Examiner* — Hung S. Bui
(74) *Attorney, Agent, or Firm* — Isidore PLLC

(57) ABSTRACT

A cam mounting mechanism ("CMM") includes a detachable mounting tray ("tray") that includes a base and two side walls. Each side wall includes engagement notches that receive a respective engagement member of a sled enclosure of a server chassis. The CMM includes two internal sliding rails ("IRRs"), each being attached to an internal surface of a respective side wall of the tray by a respective fastener that extends through a respective slide slot of the IRR, and each including the respective slide slots and multiple guide slots. Each slide slot enables the IRR to slide longitudinally relative to the side wall. Each guide slot slidably receives a respective engagement member and is shaped to constrain the tray to vertical movement relative to the sled enclosure while constraining the IRR to longitudinal movement. The CMM includes a cam handle that rotates in order to drive both IRRs to move in unison.

20 Claims, 16 Drawing Sheets

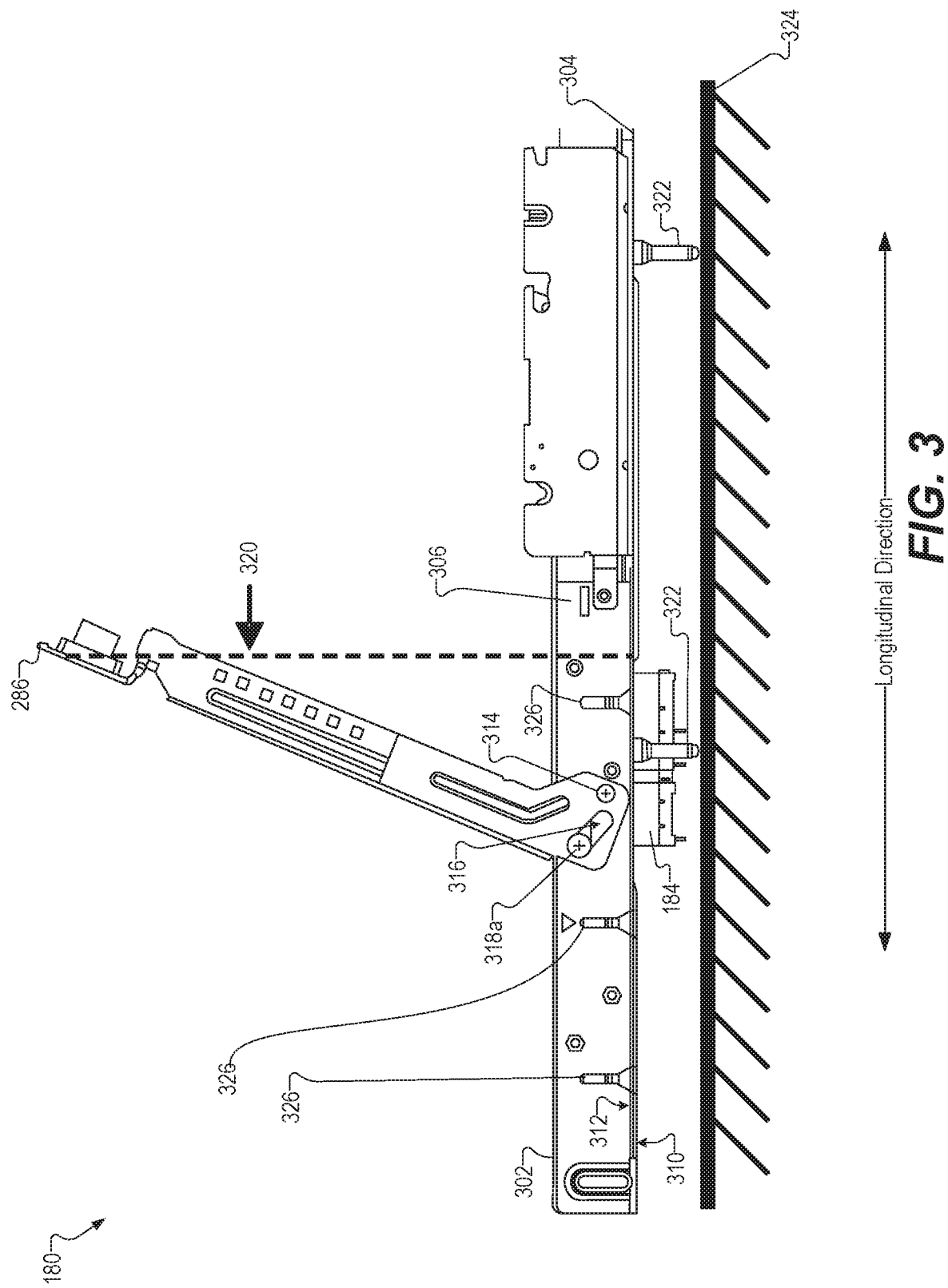

DOUBLE-LAYER COMPUTE SLED AND CAM MOUNTING MECHANISM

BACKGROUND

1. Technical Field

The present disclosure generally relates to an information handling system and in particular to a cam mounting mechanism for a double-layer compute sled in an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems can include components designed to be mounted in a rack or rack system. An example of such components is a rack-mount server. The rack system includes vertical posts that provide a frame with a plurality of mounting slots (also called bays), with each slot configured to hold a rack-mount server or another type of rack-mount component. The rack system allows multiple rack-mount servers to be stacked vertically, occupying less floor space than if the multiple servers were not stacked vertically. Further, stacking the multiple rack-mount servers vertically simplifies cable connections between servers. The rack system can include a blade server that fits inside a blade enclosure, which can hold multiple blade servers. The blade enclosure can be rack-mounted within the rack system.

A double-width blade server has double-side access. The double-side access requires a technician to access one system board from one side of the blade enclosure and access the other system board from the opposite side of the blade enclosure. As a result, a lot of time and effort is required when a technician needs to service the blade server. Additionally, a conventional rack-mount server can include a removable processor expansion module (PEM) board connected to a system board through multiple cables (e.g., four (4) cables). Such a rack-mount server includes a PEM tray that can be rotated up in order to release the PEM tray from the rack chassis. When a technician needs to service such a rack-mount server, more time and steps are needed to cable and de-cable the system, and the current method to remove and hold the PEM tray predisposes the technician to crash and damage server components. Further, the PEM tray tilts during installation, and the connector mechanism of the PEM tray cannot meet the connector requirement to avoid damage.

BRIEF SUMMARY

Disclosed are a cam mounting mechanism, an information handling system (IHS) with a double-layer sled enclosure and cam mounting mechanism designed for blind mate and one hand operation, and a method for provisioning a cam mounting mechanism for use within the IHS. According to one embodiment, the method includes providing a cam mounting mechanism configured for insertion into a double-layer sled enclosure of a server chassis. The method includes providing a detachable mounting tray. The detachable mounting tray includes a base and two side walls extending upward from the base. Each side wall of the detachable mounting tray includes at least two engagement notches. Each engagement notch is positioned to slidably receive a respective engagement member of the sled enclosure. The method includes providing two internal sliding rails that slide between an initial position closest to a front-end of the base and a final position closest to a rear-end of the base. The method includes attaching each internal sliding rail to an internal surface of a respective side wall of the mounting tray by a respective fastener that extends through a respective slide slot of the internal sliding rail. Each internal sliding rail includes the respective slide slots and at least two guide slots. Each slide slot enables the internal sliding rail to slide in a longitudinal direction relative to the side wall. Each guide slot is positioned to slidably receive a respective one of the engagement members of the sled enclosure. Additionally, each guide slot is shaped to constrain movement of the mounting tray to a vertical direction relative to the sled enclosure, while constraining movement of the internal sliding rail to the longitudinal direction relative to the engagement members of the sled enclosure. The method includes providing a cam handle and rotatably attaching the cam handle to an external surface of each side wall of the mounting tray. Additionally, the cam handle, when depressed (i.e., when a downward force is applied to the cam handle in the unlocked or open position), rotates from an unlocked position to a locked position and drives both internal sliding rails to move in unison from the initial position to the final position. In some embodiments, the method further includes inserting the cam mounting mechanism into a mating space presented in a top layer of the sled enclosure.

According to another embodiment of this disclosure, the IHS includes a server chassis that has a sled enclosure form factor. The IHS also includes a cam mounting mechanism. The cam mounting mechanism includes a detachable mounting tray. The detachable mounting tray includes a base and two side walls extending upward from the base. Each side wall of the detachable mounting tray includes at least two engagement notches. Each engagement notch is positioned to slidably receive a respective engagement member of the sled enclosure. The cam mounting mechanism includes two internal sliding rails that slide between an initial position closest to a front-end of the base and a final position closest to a rear-end of the base. Each internal sliding rail is attached to an internal surface of a respective side wall of the mounting tray by a respective fastener that extends through a respective slide slot of the internal sliding rail. Each internal sliding rail includes the respective slide slots and at least two guide slots. Each slide slot enables the internal sliding rail to slide in a longitudinal direction relative to the side wall. Each guide slot is positioned to slidably receive a respective one of the engagement members of the sled enclosure. Additionally, each guide slot is shaped to constrain movement of the mounting tray to a vertical direction relative to the sled enclosure while constraining movement of the internal sliding rail to the longitudinal direction relative to the engagement members of the sled enclosure. The cam mounting mechanism includes a cam handle that is rotatably attached to an external surface of each side wall of the mounting tray. Additionally, the cam handle, when depressed, rotates from an unlocked position to a locked position and drives both internal sliding rails to move in unison from the initial position to the final position. The IHS further includes an expansion board fixed atop the base of the mounting tray, the expansion board including one or more expansion-board server components.

According to some embodiments, the IHS additionally includes a double-layer sled enclosure. The sled enclosure houses a first layer system board and one or more system-board server components arranged to form a mating space that receives the cam mounting mechanism with the expansion board, forming a second layer within the sled enclosure. The expansion board is positioned parallel to the first layer system board.

According to another embodiment of this disclosure, a cam mounting mechanism includes a detachable mounting tray. The detachable mounting tray includes a base and two side walls extending upward from the base. The cam mounting mechanism includes two internal sliding rails that slide between an initial position near a front-end of the base of the mounting tray and a final position near a rear-end of the base of the mounting tray. The cam mounting mechanism includes a cam handle that is rotatably attached to an external surface of each side wall of the mounting tray. Additionally, the cam handle, when depressed, rotates from an unlocked position to a locked position and drives both internal sliding rails to move in unison from the initial position to the final position.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 3 illustrates a right side view of a cam mounting mechanism in an unlocked position, in accordance with one embodiment of this disclosure;

DETAILED DESCRIPTION

Figure 1:
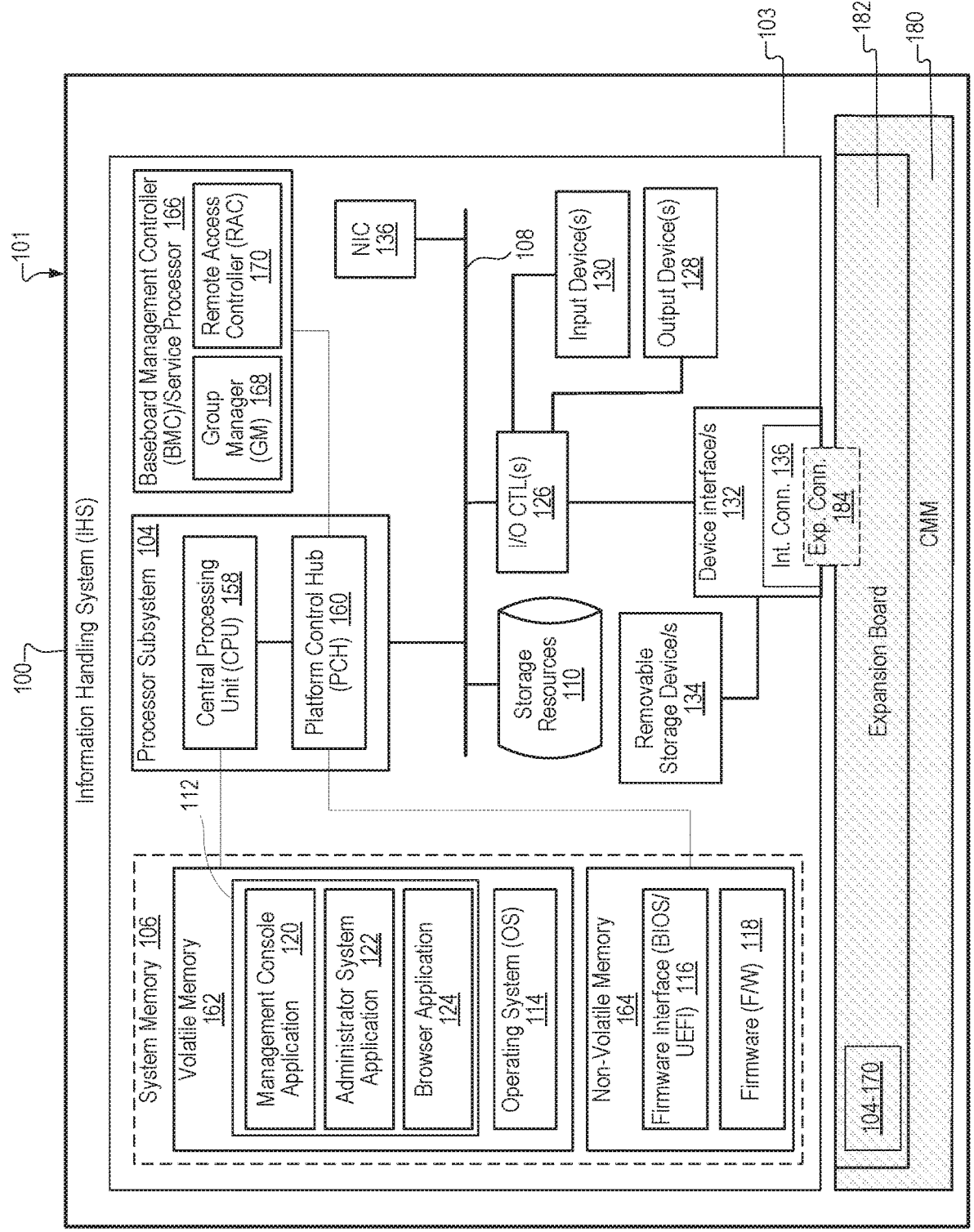
FIG. 1 illustrates a block diagram of an example information handling system (IHS) within which various aspects of the disclosure can be implemented, according to one or more embodiments of this disclosure.

The illustrative embodiments provide a cam mounting mechanism (CMM) designed for blind mate and one hand operation in an information handling system (IHS) and method for provisioning the CMM for use within the IHS. The cam mounting mechanism includes a detachable mounting tray. The detachable mounting tray includes a base and two side walls extending upward from the base. Each side wall of the detachable mounting tray includes at least two engagement notches. Each engagement notch is positioned to slidably receive a respective engagement member of a server chassis that has a double-layer compute sled form factor (also referred to as double-layer sled enclosure). The cam mounting mechanism includes two internal sliding rails that slide between an initial position closest to a front-end of the base and a final position closest to a rear-end of the base. Each internal sliding rail is attached to an internal surface of a respective side wall of the mounting tray by a respective fastener that extends through a respective slide slot of the internal sliding rail. Each internal sliding rail includes the respective slide slots and at least two guide slots. Each slide slot enables the internal sliding rail to slide in a longitudinal direction relative to the side wall. In at least one embodiment, each slide slot enables the internal sliding rail to slide in a longitudinal direction relative to the side wall. Each guide slot is positioned to slidably receive a respective one of the engagement members of the sled enclosure. Additionally, each guide slot is shaped to constrain movement of the mounting tray to a vertical direction relative to the sled enclosure while constraining movement of the internal sliding rail to the longitudinal direction relative to the engagement members of the sled enclosure. In at least one embodiment, the movement of the mounting tray is constrained (i.e., by the guide slots) to being vertical-only relative to the sled enclosure. In at least one embodiment, the movement of the internal sliding rails is constrained (i.e., by the guide slots) to being longitudinal-only relative to the engagement members of the sled enclosure.

The cam mounting mechanism includes a cam handle that is rotatably attached to an external surface of each side wall of the mounting tray. Additionally, the cam handle, when depressed, rotates from an unlocked position to a locked position and drives both internal sliding rails to move in unison from the initial position to the final position. An expansion board, including one or more expansion-board server components, is fixed atop the base of the mounting tray. The one or more expansion-board server components can communicably couple to one or more system-board server components within the sled enclosure, when an exposed connector of the cam mounting mechanism mates with an internal connector of the sled enclosure.

In the following detailed description of embodiments of the disclosure, specific embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Those of ordinary skill in the art will appreciate that the hardware, firmware/software utility, and software components and basic configuration thereof depicted in the following figures may vary. For example, the illustrative components of IHS 100 are not intended to be exhaustive, but rather are representative to highlight some of the components that are utilized to implement certain of the described embodiments. For example, different configurations of an IHS may be provided, containing other devices/components, which may be used in addition to or in place of the hardware depicted, and may be differently configured. The depicted example is not meant to imply architectural or other limitations with respect to the presently described embodiments and/or the general invention. Reference numerals with sub-numerals will be referred to by the primary reference number (e.g., ###a-###d will be referred to collectively as ###) for simplicity in presenting the description.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, read-only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The IHS 100 may also include one or more buses operable to transmit communications between the various hardware components.

Figure 2A:
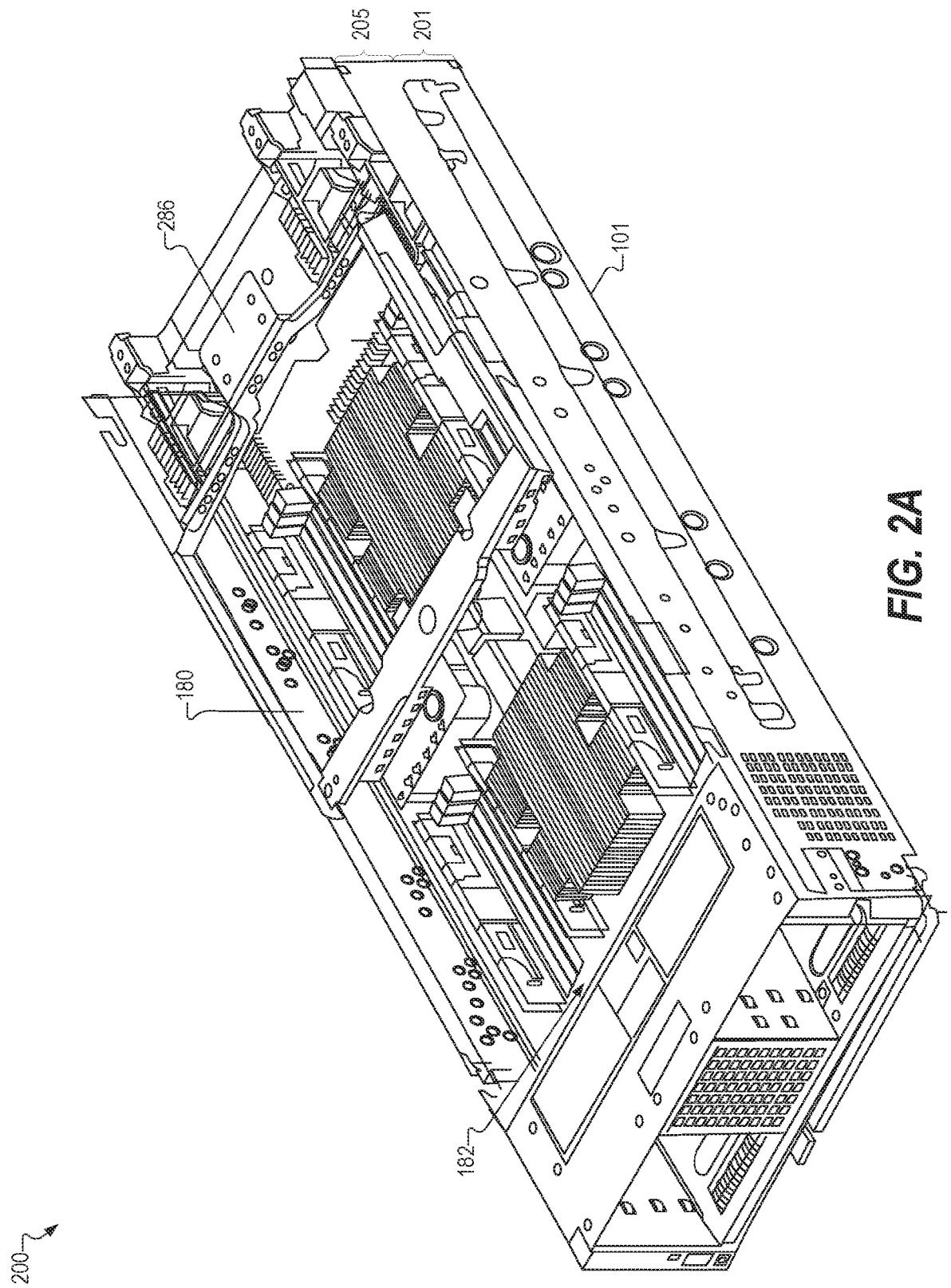
FIG. 2A illustrates an example three-dimensional structure of the information handling system of FIG. 1 within which various aspects of the disclosure can be implemented, according to one or more embodiments of this disclosure.

IHS 100 of FIG. 1 is depicted as a 2-dimensional block diagram; however, it is understood that IHS 100 is physically configured as a 3-dimensional device, as illustrated by FIG. 2A, and the description of certain physical attributes of IHS 100 will be described with reference to those components within FIG. 2A. As shown by FIGS. 1 and 2A, IHS 100/200 includes functional compute components encased in an external casing (namely, chassis 101) to form a server 200. Server 200 can be designed to be mounted to a rack system, providing a rack-mount server. Chassis 101 is made of a structurally rigid material that serves to enclose and protect the components of IHS 100 from physical damage. This disclosure is not limited to a chassis 101 to having a horizontal orientation (i.e., relative to the ground/floor), such as a rack-mounted server, which generally has standardized width dimensions (such as half-width, single-width, or double-width) and standardized height dimensions (such as 1 U, 2 U, 3 U, or 4 U). In at least one embodiment, chassis 101 has an orientation orthogonal relative to the ground/floor, such as a blade server. In at least one embodiment of this disclosure, chassis 101 is formed as a double-layer sled enclosure. A double-layer sled enclosure is able to enclose two printed circuit boards (PCBs) (e.g., motherboards) in a layered arrangement. For example, a first layer PCB can be fixed to a base of the sled enclosure, and a second layer PCB can be positioned substantially parallel to the first PCB.

Referring specifically to FIG. 1, IHS 100 includes at least one PCB positioned on a first layer, and which is herein interchangeably referred to as "first layer system board" 103 or simply as "system board" 103. System board 103 is a planar PCB on which is mounted a plurality of interconnected functional components. For example, IHS 100 includes processor subsystem 104 coupled to system memory 106 via system interconnect 108. System interconnect 108 can be interchangeably referred to as a system bus, in one or more embodiments. System interconnect 108 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. System interconnect 108 communicatively couples various system components including, for example, replaceable local storage resources 110, such as solid-state drives (SDDs) and hard disk drives (HDDs). Within local storage resources 110 can be stored one or more software and/or firmware modules and one or more sets of data that can be utilized during operations of IHS 100. Specifically, in one embodiment, system memory 106 can retrieve from local storage resources 110 a plurality of such modules for execution by processor subsystem 104. System memory 106 stores such modules in volatile memory 162 and non-volatile memory 164. The modules can include one or more of application(s) 112, operating system (OS) 114, a firmware interface 116 such as basic input/output system (BIOS) or Uniform Extensible Firmware Interface (UEFI), and platform firmware (F/W) 118. These software and/or firmware modules have varying functionality when their corresponding program code is executed by processor subsystem 104 or secondary processing devices within IHS 100. For example, application(s) 112 may include a management console application 120, an administrator system application 122, and a browser application 124, each enabling IHS 100 to operate in one or more of the corresponding roles within a computing network system.

IHS 100 includes I/O controllers 126 and device interface(s) 132. I/O controllers 126 support connection to and forwarding of output signals to one or more connected output devices 128, such as a monitor or display device or audio speaker(s). Additionally, in one or more embodiments, one or more I/O devices or input devices 130, such as an optical reader, a USB, a card reader, Personal Computer Memory Card International Association (PCMCIA) slot, and/or a high-definition multimedia interface (HDMI), can be associated with IHS 100. Device interface(s) 132 can be utilized to enable data to be read from or stored to corresponding removable storage device/s 134, such as a compact disk (CD), digital video disk (DVD), flash drive, or flash memory card. In one or more embodiments, device interface(s) 132 can further include general purpose I/O interfaces such as inter-integrated circuit ($I^2C$), system management bus (SMB), and peripheral component interconnect (PCI) buses. In one or more embodiments, device interface(s) 132 further include at least one internal connector 136 that enables system board 103 to communicably couple to another PCB.

IHS 100 comprises a network interface controller (NIC) 136. NIC 136 enables IHS 100 and/or components within IHS 100 to communicate and/or interface with other devices, services, and components that are located external to IHS 100. These devices, services, and components can interface with IHS 100 via an external network.

Processor subsystem 104 can include central processing unit (CPU) 158 that is augmented by a platform control hub (PCH) 160. CPU 158 can execute applications 112 and OS 114 in volatile memory 162 of system memory 106. PCH 160 interfaces with functional components of IHS 100, such as firmware interface 116 and platform firmware 118 stored in non-volatile (NV) memory 164 of system memory 106, and a baseboard management controller (BMC)/service processor 166. BMC/service processor 166 can also include a remote access controller (RAC) 170 that enables out-of-band communication for the IHS 100. For example, BMC)/service processor 166 can communicate out-of-band via NIC 136 and external network to the network devices that are located external to IHS 100.

The above described functional compute components (104-170) are coupled to system board 103, and together are herein referred to as "system-board server components." In accordance with embodiments of this disclosure, IHS 100 includes a cam mounting mechanism (CMM) 180 (shown in FIG. 1 as "CMM") designed for blind mate and one hand operation for insertion into and removal from the double-layer sled enclosure of chassis 101. Cam mounting mechanism 180 is designed to frame at least one second layer PCB that is affixed atop cam mounting mechanism 180. Additional details about cam mounting mechanism 180 are described below with reference to later FIGS. 2A-11.

In accordance with embodiments of this disclosure, IHS 100 includes at least one second layer PCB, which is herein interchangeably referred to as "second layer expansion board" 182 or simply as "expansion board" 182. Expansion board 182 is a planar PCB. Expansion board 182 is affixed (i.e., by fastener, adhesive, etc.) to cam mounting mechanism 180, which enables expansion board 182 to be inserted into IHS 100 with minimal time, effort, misalignment, or damage. Expansion board 182 could have the same or similar configuration as system board 103. That is, expansion board 182 enables doubling the functionality of system board 103. In at least one embodiment, the size of expansion board 182 is the same size as system board 103. In comparison, a conventional server includes a small-scale PEM board on a cam mounting tray, but the small-scale PEM board has less functionality that the larger system board. Expansion board 182 could have coupled thereto functional compute components (herein referred to as "expansion-board server components") that are identical or similar to the system-board server components 104-170 coupled to system board 103. Expansion-board server components can be mounted onto, attached to, or otherwise connected to expansion board 182. Expansion board 182 includes at least one exposed connector 184, which is coupled to expansion board 182 and is designed to enable expansion board 182 to communicably couple with system board 103 in order to share data, power, and computer processor resources with expansion board 182. Similarly, in one or more embodiments, device interface(s) 132 of system board 103 includes an internal connector 136. Internal connector 136 is designed to enable first layer system board 103 to communicably couple with second layer expansion board 182 of IHS 100 by blind mating with exposed connector 184 of second layer expansion board 182. More particularly, exposed connector 184 and internal connector 136 are blind mate connectors that can be fully mated without visual indicators.

Referring now to FIG. 2A, the three-dimensional structure of information handling system 100 is herein referred to simply as information handling system 200. It is understood that components of IHS 100 are included within IHS 200. For example, chassis 101, cam mounting mechanism 180, expansion board 182 represented in FIG. 1 are illustrated as three-dimensional structures in FIG. 2A. For simplicity, the double-layer sled enclosure type server chassis 101 is herein referred to simply as sled enclosure 101. Details about the structure of sled enclosure 101 are describe below with the description of FIG. 4A.

As shown in FIG. 2A, in the vertical direction, the height of sled enclosure 101 can be split into two layers, namely, a first layer 201 and a second layer 205. As an example, each of the layers can have a height that is half of the height of sled enclosure 101, such that the first layer 201 represents the internal space below the vertical center of sled enclosure 101, and the second layer 205 represents the internal space above the vertical center of sled enclosure 101. It is understood that within sled enclosure 101, the separation between the first and second layers 201 and 205 is not limited to being an absolute center, and that the two layers can have unequal heights without departing from the scope of this disclosure.

Hidden from view in FIG. 2A, the first layer 201 of sled enclosure 101 houses system board 103 and one or more system-board server components, which are arranged in first layer 201 of sled enclosure to leave a mating space (above the one or more system-board server components) that is configured to receive and house cam mounting mechanism 180 with the expansion board 182. An example of system board server components hidden from view include multiple processor sockets 202c and 202d (FIG. 4), which are similar to the multiple processor sockets 202a and 202b shown in FIG. 2B. The mating space is located in the second layer 205 space of sled enclosure 101. As shown in FIG. 2A, the mating space is occupied by cam mounting mechanism 180. That is, sled enclosure 101 houses cam mounting mechanism 180 internally, as a subchassis of a second layer. As part of the second layer, cam mounting mechanism 180 is located above the system board 103 (shown in FIGS. 2C and 4A). Expansion board 182 is affixed to cam mounting mechanism 180, and various expansion-board server components are mounted on expansion board 182. Cam mounting mechanism 180 provides a frame (e.g., subchassis) on which expansion board 182 is affixed and which supports the weight of expansion board 182 and various expansion-board server components.

Figure 2B:
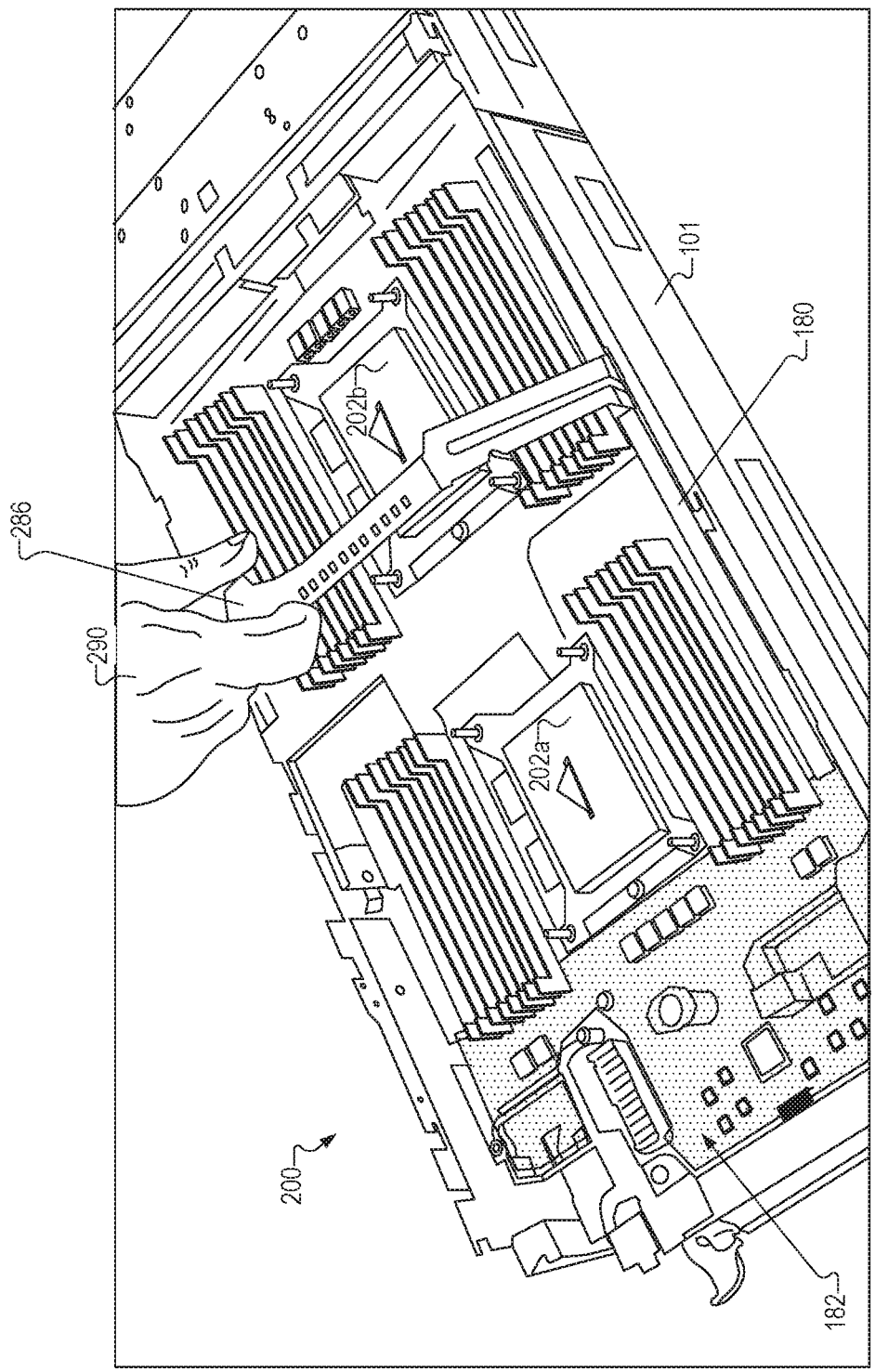
FIG. 2B illustrates a portion of the information handling system of FIG. 2A within which the cam handle has been lifted from a locked position to an unlocked position, in accordance with one embodiment of this disclosure.

Cam mounting mechanism 180 includes cam handle 286 that can be rotated in one direction in order to securely lock cam mounting mechanism 180 within sled enclosure 101, and that can be rotated in the opposite direction in order to unlock cam mounting mechanism 180 from sled enclosure 101. As shown, in FIG. 2A, cam handle 286 is fully rotated into a locked position, and cam mounting mechanism 180 is locked within sled enclosure 101. According to one aspect, and as shown by FIG. 2B, in order to securely lock cam mounting mechanism 180 within sled enclosure 101, only one hand of a technician is needed to depress cam handle 286 down. In some embodiments, when cam mounting mechanism 180 is fully rotated down into the locked position, cam handle 286 is parallel relative to the plane of expansion board 182. It is understood that this disclosure is not limited to having cam handle 286 form a zero-degree (0°) angle (shown in FIG. 2A) with the plane of expansion board 182 when cam handle 286 is in the locked position, and that in other embodiments, other angles can be formed between the plane of expansion board 182 and cam handle 286 in the locked position.

FIG. 2B illustrates a portion of information handling system 200 of FIG. 2A with cam handle 286 lifted from a locked position to an unlocked position, in accordance with one embodiment of this disclosure. As shown, cam handle 286 can be lifted upright by a single hand 290 of a technician, in order to unlock cam mounting mechanism 180 from sled enclosure 101. The upward lifting force applied by hand 290 of the technician on cam handle 286 causes cam handle 286 to rotate (e.g., pivot) out of the locked position. When cam handle 286 has fully rotated to an unlocked position (i.e., at or close to its maximum opening angle), cam mounting mechanism 180 can be removed from sled enclosure 101 by further applying a lifting force on cam handle 286 in the vertical direction. In some embodiments, when cam mounting mechanism 180 is fully rotated up into the unlocked position, the center of cam handle 286 is substantially perpendicular relative to the plane of expansion board 182. It is appreciated that the disclosure is not limited to having cam handle 286 form a ninety-degree (90°) angle with the plane of expansion board 182 when cam handle 286 is in the unlocked position. In other embodiments (such as the example shown in FIG. 2B), non-orthogonal angles can be formed between the plane of expansion board 182 and cam handle 286 in the unlocked position. As shown in FIG. 2B, although cam handle 286 is in the unlocked position, cam mounting mechanism 180 remains resting inside sled enclosure 101, as no further lifting force has been applied in the vertical direction to cam handle 286.

Figure 2C:
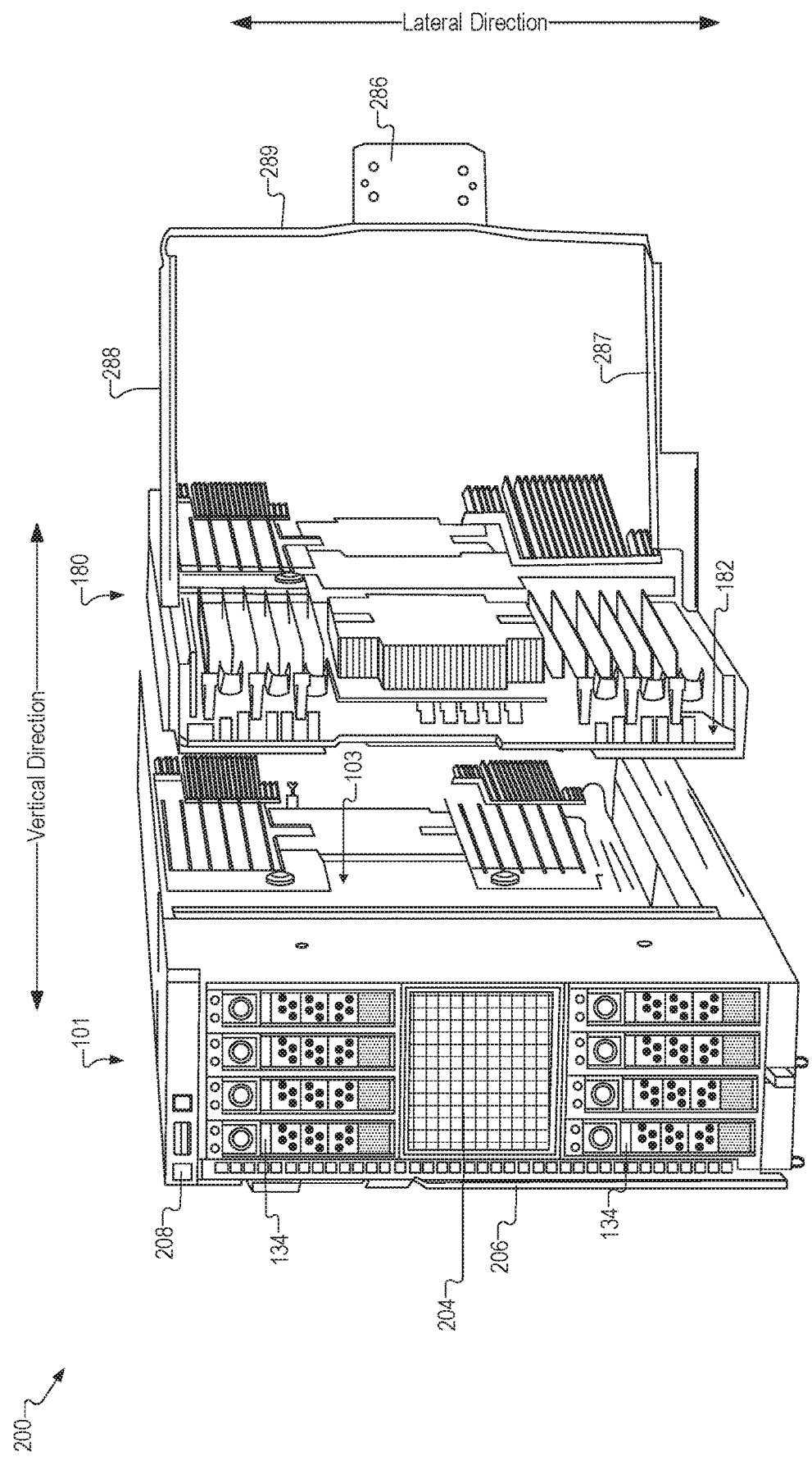
FIG. 2C illustrates a cam mounting mechanism detached from the sled enclosure of the information handling system of FIG. 2A, in accordance with one embodiment of this disclosure.

FIG. 2C illustrates a front view of cam mounting mechanism 180 detached from the double-layer sled enclosure 101 of the information handling system 200 of FIG. 2A, in accordance with one embodiment of this disclosure. That is, while cam handle 286 was in the unlocked position, a further lifting force has been applied in the vertical direction to cam handle 286, and as a result, cam mounting mechanism 180 has been detached from and removed outside of sled enclosure 101. Cam handle 286 is formed as a u-shaped frame that includes a right arm frame-portion 287, a left arm frame-portion 288, and a cross-arm frame-portion 289. In one or more embodiments, cam handle 286 is longitudinally symmetrical. The right arm frame-portion 287 is rotatably attached to the external surface of the right side wall 306 of mounting tray 302 by a pivot anchor 314 (for example, a pivot screw, or similar fastener).

During removal from sled enclosure 101, cam mounting mechanism 180 is constrained to slide in a vertical direction, and as a result, expansion board 182 and system board 103 maintain parallel positions relative to each other to avoid expansion board contacting components of system board 103.

The front view of cam mounting mechanism 180 shows various additional components that can be attached onto or removed from IHS 200 at the front face of the server. Examples of these additional components include a bezel 204, USB port(s), removeable storage devices (e.g. eight (8) hard drives) 134, release lever 206, and a power button 208.

FIG. 3 illustrates a right-side view of cam mounting mechanism 180 (FIGS. 2A-2C) in an unlocked position, in accordance with one embodiment of this disclosure. As shown, cam mounting mechanism 180 includes cam handle 286 and detachable mounting tray 302. Mounting tray 302 includes a base 304 and two side walls (namely, right side wall 306 and left side wall 422 (hidden from view in FIG. 3, but shown as 422 in FIG. 4B)) extending upward from base 304. Base 304 has a planar shape and includes a bottom surface 310 and a top surface 312. In some embodiments, the two side walls extend upward from and substantially orthogonal to the base 304.

The right arm frame-portion 287 of cam handle 286 also includes a drive slot 316, through which a fastener 318a extends in order for angular actuation of cam handle 286 to drive right internal sliding rail 904 (shown in FIG. 9B) to move in unison with cam handle 286. Similarly, the left arm frame-portion 288 is rotatably attached to the external surface of the left side wall 422 of mounting tray 302 by a pivot anchor 314. The left arm frame-portion 288 also includes a drive slot 316, through which a fastener 318b (FIG. 9B) extends in order for angular rotation of cam handle 286 to drive left internal sliding rail 450 (shown in FIG. 4B) to move in unison with cam handle 286. Together, the pivot anchor 314 of each of the two side walls 306 and 422 form a lateral axis about which cam handle 286 rotates between the locked position (shown in FIG. 2A) and the unlocked position shown in FIG. 3.

According to one or more embodiments, cam handle 286 is lightweight relative to the remainder of the cam mounting mechanism 180. With these embodiments, the position of cam handle 286, whether at or intermediately between its unlocked and locked positions, has a negligible effect on the center of mass of cam mounting mechanism 180, as a whole. Cam handle 286 is attached (e.g., hinged) to cam mounting mechanism 180 proximate to the center of mass of cam mounting mechanism 180 such that when cam handle 286 is positioned at or intermediately between its unlocked and locked positions, the cam mounting mechanism 180 will remain horizontal. This design aspect prevents tilting of the cam mounting mechanism 180, which avoids or substantially reduces the likelihood of cam mounting mechanism 180 impacting and potentially damaging the lower components (e.g., exposed connector 184). According to one embodiment, while cam handle 286 is in the unlocked position, cam handle 286 is located at the center of mass of cam mounting mechanism 180 such that the weight of mounting tray 302 is balanced. More particularly, the weight of mounting tray 302 is balanced laterally and longitudinally. As a result, lateral cross-sectional line 320 of mounting tray 302 at its center of mass intersects the center of cam handle 286 and is perpendicular to the base 304 of mounting tray 302.

Example expansion board 182 includes two exposed connectors 184. When expansion board 182 is affixed to the top surface 312 of base 304, each exposed connector 184 extends through a respective one of the connector openings 908 (FIG. 9A) in base 304 of mounting tray 302. Exposed connectors 184 thus extend downward beyond the bottom surface 310 of base 304.

Cam mounting mechanism 180 also includes multiple vertical guide pins 322 that extend orthogonally downward from the bottom surface 310 of base 304, beyond the bottom surface of exposed connectors 184. In order for exposed connectors 184 to blind-mate with respective internal connectors 136 (shown in FIG. 4A) of the sled enclosure, each guide pin 322 is positioned to insert into a respective guide socket 402 (shown in FIG. 4A) of sled enclosure 101. The longer length of guide pins 322 compared to exposed connectors 184, enables guide pins 322 to have first contact with mounting tray 302 during insertion into sled enclosure 101, and specifically, into the mating space. Also, the longer length of guide pins 322 enables guide pins 322 to protect exposed connectors 184 from unintentional collisions with staging surface 324 (e.g., ground, table top, shipping box) upon which cam mounting mechanism 180 rests. The longer length of guide pins 322 enables the guide pins 322 to be the initial points of physical contact with guide sockets 402 (or other components housed inside of sled enclosure 101). That is, guide pins 322 protect exposed connectors 184 from collisions with sled enclosure 101 (or components housed inside of sled enclosure 101) while a technician manually inserts cam mounting mechanism 180 into the mating space.

Each of the side walls 306 and 422 of mounting tray 302 includes at least one engagement notch 326. Each engagement notch 326 is positioned to slidably receive a corresponding engagement member (462 of FIG. 4B) of sled enclosure 101. Each engagement notch 326 has an open bottom through which the engagement notch 326 slidably receives a corresponding attachment member 410 of the sled enclosure 101. In the example shown in FIG. 3, right side wall 306 includes three (3) engagement notches 326.

Figure 4A:
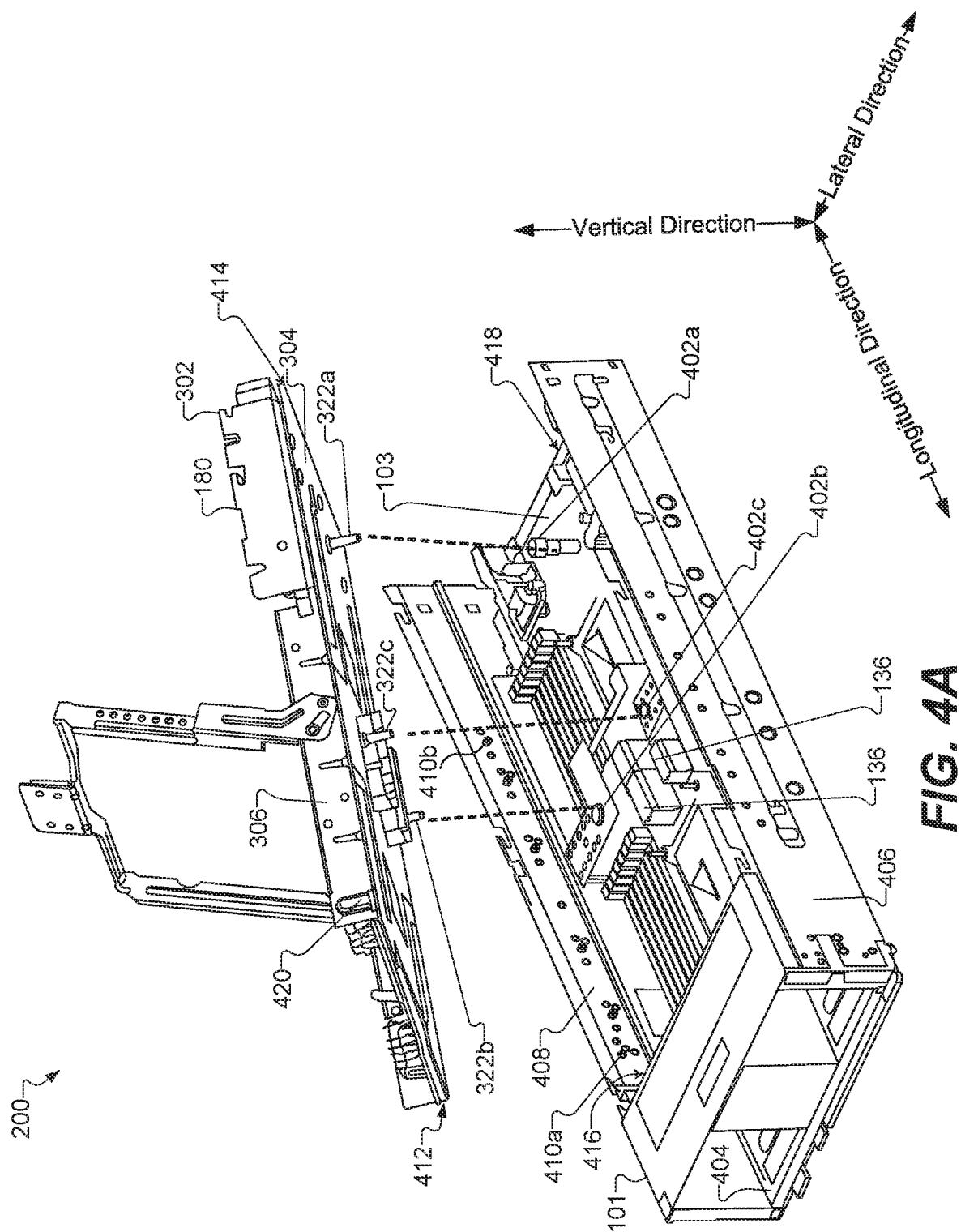
FIG. 4A illustrates a bottom perspective view of the cam mounting mechanism of FIG. 3 with guide pins aligned for mating with guide sockets of the sled enclosure of the information handling system of FIG. 2A, according to one embodiment.

FIG. 4A illustrates a bottom perspective view of cam mounting mechanism 180 of FIG. 2 with guide pins 322 (specifically illustrated as guide pin(s) 322a-322c) aligned for mating with guide sockets 402 (specifically illustrated as guide socket(s) 402a-402c) of sled enclosure 101 of information handling system 200 of FIG. 2A. In the example shown in FIG. 4A, the multiple vertical guide pins of cam mounting mechanism 180 includes a first guide pin 322a, a second guide pin 322b, and a third guide pin 322c. Sled enclosure 101 includes corresponding first, second, and third guide sockets 402a, 402b, and 402c. Other embodiments of an IHS can include a different number of guide pins 322 and guide sockets 402 without departing from the scope of this disclosure. First guide socket 402a and first guide pin 322a are positioned near the rear end of IHS 200. Second guide socket 402b and third guide socket 402c are positioned near the center of sled enclosure 101. Correspondingly, second guide pin 322b and third guide pin 322c are positioned near the center of cam mounting mechanism 180. Guide sockets 402a-402c, which are attached to system board 103, are positioned to receive corresponding guide pins 322a-322c as initial points of physical contact with the cam mounting mechanism 180 being guided into the mating space.

Sled enclosure 101 includes a planar base 404, two side walls (namely, right side wall 406 and left side wall 408) extending upward from the base 404. System board 103 is attached to the top surface of base 404 of the sled enclosure 101. The mating space (formed by the spatial arrangement of system-board server components on system board 103 and walls of sled enclosure 101) is unoccupied, as shown in FIG. 4A.

Sled enclosure 101 includes at least two attachment members 410 fixed to an internal surface of each side wall 406 and 408, proximate a front-end 416 and rear-end 418, respectively, of the mating space. That is, each of the side walls 406 and 408 of sled enclosure 101 includes at least one of the attachment members 410. For example, the left side wall 408 includes two of the attachment members 410, namely, first and second attachment members 410a and 410b. The right side wall 406 includes one of the attachment members 410. As an example, attachment member 410 can be a T-nut. Together, the multiple attachment members 410 enable the front-end 412 and rear-end 414 of base 304 of mounting tray 302 to align with a front-end 416 and rear-end 418 of the mating space of the sled enclosure. The multiple attachment members 410 enable external surfaces of the side walls of the mounting tray 302 to align within internal surfaces of side walls 406 and 408 of sled enclosure 101. Each of the attachment members 410 slides into a corresponding alignment notch 420, attaching a side wall of sled enclosure 101 to a parallel side wall of mounting tray 302.

Each of the side walls 306 and 422 of mounting tray 302 includes at least one alignment notch 420. Each alignment notch 420 has an open-bottom shape and is positioned to slidably receive a respective attachment member 410 of sled enclosure 101. The interior of each alignment notch 420 has vertical walls facing each other and spaced apart by the width (i.e., in the longitudinal direction) of the alignment notch 420. The alignment notch 420 has a width narrower than its vertical height. Each alignment notch 420 guides a corresponding attachment member 410 in the vertical direction. In at least one embodiment, vertical walls alignment notch 420 guide a corresponding attachment member 410 in the vertical-only direction. The narrow width of alignment notch 420 allows the shaft of attachment member 410 to slide along the vertical walls of alignment notch 420. The narrow width of alignment notch 420 prevents the attachment member 410 from moving laterally, and thereby prevents mounting tray 302 from moving laterally relative to a corresponding side wall 406, 408 of sled enclosure 101. The above described open-bottom shape and function of assignment notch 420 is similar to the shape and of engagement notch 326.

Right side wall 306 of mounting tray 302 includes one alignment notch 420 positioned near the front-end of mounting tray 302, and through its open bottom, this alignment notch 420 slidably receives the corresponding one attachment member 410 of the right side wall 406 of the sled enclosure 101. Once alignment notch 420 receives the corresponding attachment member 410, the right side wall 306 of mounting tray 302 is attached to and aligned parallel, relative to the right side wall 406 of sled enclosure 101. Examples of expansion-board server components shown in FIG. 4A include multiple processor sockets 202c and 202d.

In FIG. 4A, the terms "vertical," "lateral," and "longitudinal" directions are relative to the base 404 of chassis 101. When chassis 101 is a rack-mounted server, the ground/floor is generally parallel to the system board 103 and base 404 of the chassis 101. However, when chassis 101 is a blade server, the ground/floor is generally orthogonal to system board 103 and to base 404 of chassis 101. More particularly, depending on the orientation of base 404, a vertical direction that is orthogonal relative to the ground/floor may not always be the same vertical direction that is determined relative to the base 404 of chassis 101.

Figure 4B:
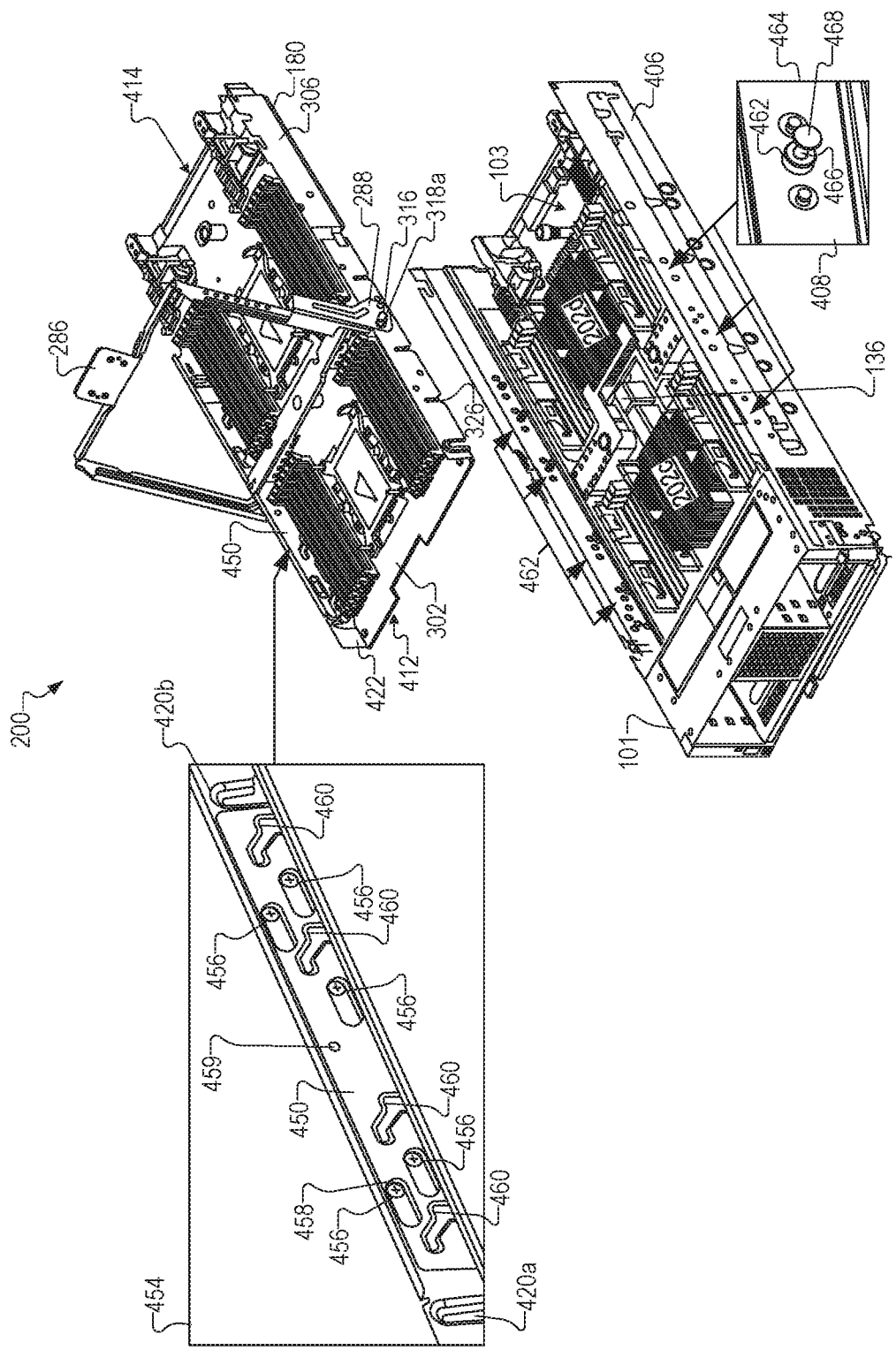
FIG. 4B illustrates a top perspective view of the cam mounting mechanism of FIG. 3 positioned above a mating space of the sled enclosure of the information handling system of FIG. 2A, according to one embodiment.

FIG. 4B illustrates a top perspective view of cam mounting mechanism 180 of FIG. 2A positioned above a mating space of the sled enclosure 101 of information handling system 200 of FIG. 2A. Cam mounting mechanism 180 includes two internal sliding rails (ISR), including left ISR 450 and right ISR 904 (shown in FIG. 9B). An enlarged view of the interior surface of left ISR 450 is illustrated in zoom-frame 454. Each of ISRs 450 and 904 is attached to an internal surface of a respective side wall 306 and 422 of mounting tray 302 by a respective fastener 456. Examples of fastener 456 include a screw, a bolt, or a rivet. Each of fasteners 456 extends through a respective slide slot 458 of the ISRs 450 and (hidden from view in FIG. 4B, shown as 904 in FIG. 9B). That is, each of the ISRs 450 and 904 includes one or more slide slots 458 that enable the ISR to slide in a longitudinal direction relative to the corresponding one of the side walls 306 and 422 of mounting tray 302. In at least one embodiment, slide slots 458 constrain movement of the ISR to being longitudinal-only relative to the corresponding one of the side walls 306 and 422 of mounting tray 302. Each of the ISRs 450 and 904 are configured to slide between an initial position (shown in zoom-frame 454 and FIG. 6B) that is located near the front-end 412 of mounting tray 302 and a final position (shown in FIG. 8B) that is located near the rear-end 414 of mounting tray 302. As a particular example, when left ISR 450 is in its initial position, as shown in FIG. 4B, left ISR 450 is located closest to first alignment notch 420a, which provides an opening through left side wall 422 of mounting tray 302, near front-end 412. When left ISR 450 is in its final position, left ISR 450 is located closest to second alignment notch 420b, which provides an opening through left side wall 422 of mounting tray 302, near rear-end 414. It is understood that analogous to the movement of left ISR 450, right ISR 904 slides in a longitudinal direction between its initial position and final position.

Each of the ISRs 450 and 904 includes a drive hole 459. In order for angular rotation of cam handle 286 to drive right ISR 904 to move in unison with the cam handle 286, fastener 318a attaches right arm frame-portion 288 (FIG. 2C) of cam handle 286 to right ISR 904. More particularly, fastener 318a extends through the following: a drive slot 316 of right arm frame-portion 287; a horizontal-drive slot 902 (FIG. 9B) of right side wall 406 of sled enclosure 101, and a drive hole (hidden from view in FIG. 4B, shown as 459a in FIG. 9B) of right ISR. Analogously, fastener 318b (FIG. 9B) extends through drive hole 459b (FIG. 9B), attaching left arm frame-portion 288 to left ISR 450 such that angular rotation of cam handle 286 drives left ISR 450 to move in unison with the cam handle 286.

Each of the ISRs 450 and 904 includes at least two guide slots 460, which can be z-shaped in some embodiments. As a particular example, left ISR 450 includes four (4) z-shaped guide slots 460, as shown in zoom-frame 454 of FIG. 4B. Right ISR 904 includes three (3) z-shaped guide slots 460 (hidden from view). In other embodiments, the right ISR could have the same quantity of guide slots 460 as the left ISR. Each guide slot 460 is positioned to slidably receive a respective one of the engagement members 462 of sled enclosure 101. An enlarged view of one of the engagement members 462, which is affixed to the interior surface of right side wall 406 of sled enclosure 101, is illustrated in zoom-frame 464. Each engagement member 462 extends laterally toward the center of sled enclosure 101. Each engagement member 462 includes a shaft 466 for sliding within a guide slot 460, and includes a head 468 that extends radially outward from the shaft, preventing lateral movement of ISR 450, 904 relative to a corresponding side wall 422, 306 of mounting tray 302, and preventing lateral movement of mounting tray 302 relative to sled enclosure 101. As an example, engagement member 462 can be a T-nut.

The above described shape and components (e.g., T-nut shape with a head and shaft) of engagement member 462 is similar to the shape and components of attachment member 410. Each guide slot 460 is shaped to constrain movement of mounting tray 302 to a vertical (i.e., orthogonal) direction relative to the sled enclosure 101 (e.g., relative to the face of the system board 103 attached to sled enclosure 101), while constraining movement of the corresponding ISR 450, 904 to the longitudinal direction relative to the engagement members 462 of sled enclosure 101. In at least one embodiment, guide slots 460 constrain movement of the mounting tray 302 to being vertical-only relative to sled enclosure 201, while constraining the movement of the corresponding ISR 450, 904 to being longitudinal-only relative to the engagement members 462 of the sled enclosure 101. Each guide slot 460 has an open bottom through which a shaft 466 of an engagement member 462 enters the guide slot 460. The diagonal portion of each guide slot 460 guides diagonal motion of the corresponding ISR 450, 904 relative to the stationary shaft 466 of the engagement member 462.

The diagonal motion of left ISR 450 is generated, in part, from mounting tray 302 (to which left ISR 450 is fixedly attached) descending in the vertical direction relative to sled enclosure 101, based on engagement notches 326 constraining four (4) engagement members 462 in the vertical only direction. Particularly, left side wall 422 includes four (4) engagement notches 326, each corresponding to a respective one of the four (4) engagement members 462 shown in FIG. 4B. The diagonal motion of left ISR 450 is generated, in part, from mounting tray 302 descending in the vertical direction relative to sled enclosure 101, based on alignment notches 420 constraining two (2) attachment members 410. Additionally, the diagonal motion of left ISR 450 is generated, in part, from left ISR 450 sliding from the initial position to the final position in the longitudinal direction relative to mounting tray 302. Four (4) slide slots 458 constrain fasteners 456 for left ISR 450 to slide from the initial position to the final position in the longitudinal direction relative to mounting tray 302.

In order to prevent collision damage to IHS 200 during insertion and removal of cam mounting mechanism 180, all degrees of freedom of motion of cam mounting mechanism 180 are controlled. Movement of cam mounting mechanism 180 is constricted vertically (i.e., up and down), longitudinally (i.e., front and rear), and laterally (i.e., right and left). Movement of cam mounting mechanism 180 is constricted from spinning clockwise or counterclockwise. As described above with reference to FIG. 3, during installation, vertical motion of the cam mounting mechanism 180 is initially, bluntly controlled by the hand 290 (FIG. 2B) of the technician holding cam handle 286 while inserting guide pins 322 into guide sockets 402. As described above with reference to FIG. 4A, horizontal motion (including both longitudinal and lateral motion) of the cam mounting mechanism 180 is controlled by alignment notches 420 receiving and becoming attached to attachment members 410, at the front-ends and rear-ends of mounting tray 302 and the mating space, respectively. Now, in FIG. 4B, vertical motion of the cam mounting mechanism 180 is subsequently, precisely controlled by a combination of engagement members 462 of sled enclosure 101, which extend through both a corresponding engagement notch 326 of a slide wall 306, 422 of mounting tray 302 and a corresponding guide slot 460 of a corresponding ISR 450, 904. Guide slots 460 are optimized to ensure the precise vertical motion of mounting tray 302.

Cam mounting mechanism 180 holds the expansion board 182 in parallel position with the system board 103 when cam mounting mechanism 180 is engaged within sled enclosure 101, as shown in FIG. 4B. In some embodiments, in order for expansion board 182 to engage with (e.g., be communicable coupled to) system board 103 through internal and exposed connectors 136 and 184, cam mounting mechanism 180 enables expansion board 182 to move vertically straight down, into a position that is parallel to system board 103, without tilting or shifting. Tilting or shifting of the expansion board 182 out of the position that is parallel to system board 103 can damage server components or PCBs. As well, tilting or shifting of the expansion board 182 out of the position that is parallel to system board 103 can cause misalignment between internal and exposed connectors 136 and 184. Such misalignment can result in a failure to connect internal connectors 136 to exposed connectors 184, or a failure to communicably couple expansion board 182 to system board 103.

Figure 5:
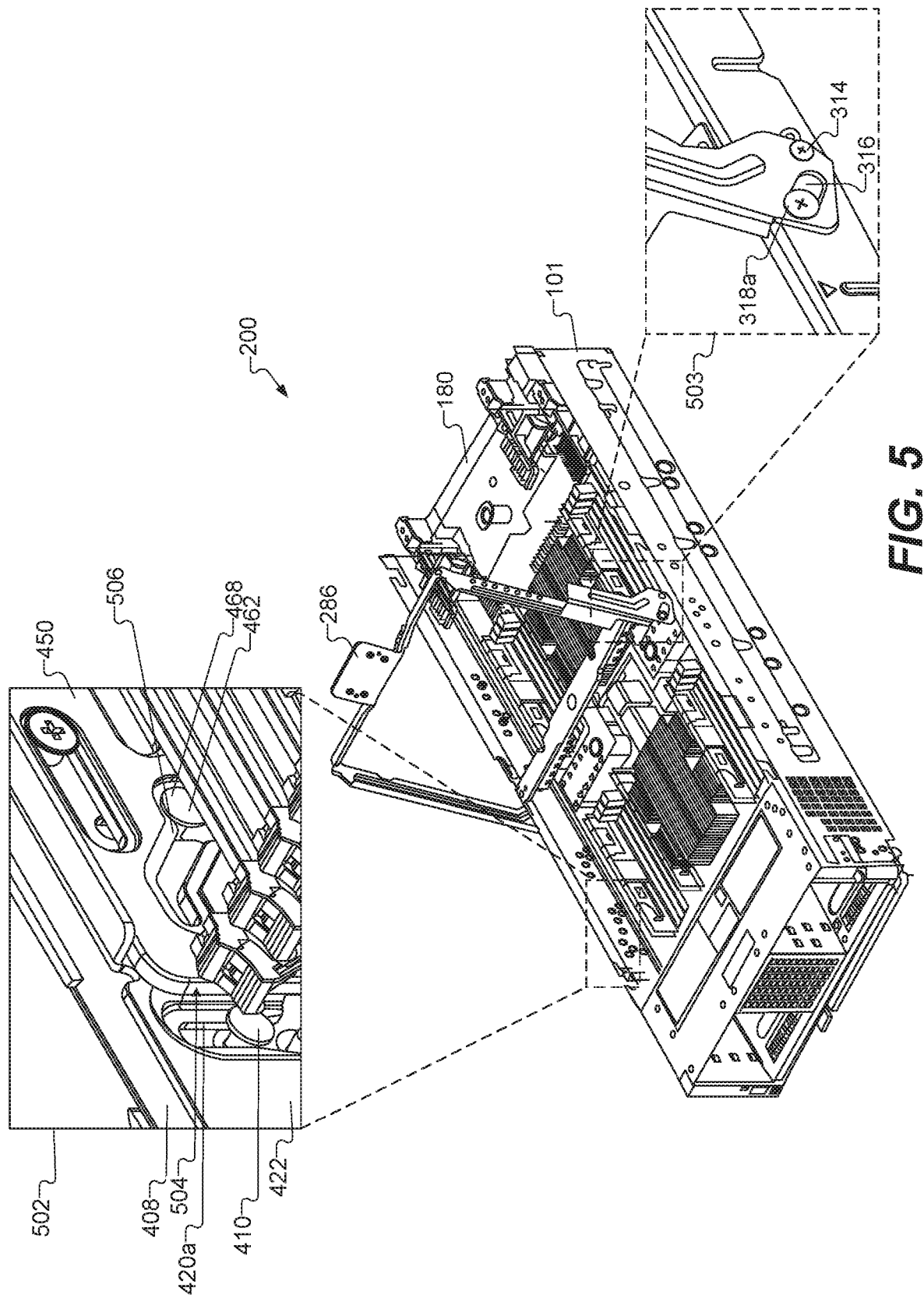
FIG. 5 illustrates rotation and offset prevention features of the cam mounting mechanism that is mated with the sled enclosure of the information handling system of FIG. 2A, according to one embodiment.

FIG. 5 illustrates rotation and offset prevention features of cam mounting mechanism 180, which is with the sled enclosure 101 of the information handling system 200 of FIG. 2A. As shown, cam handle 286 is in the unlocked position, and left ISR 450 is in its initial position, closest to first alignment notch 420a. In unison, right ISR 904 is in its initial position (hidden from view in FIG. 5). In FIG. 5, an enlarged view of the interior surface of the front-end of left ISR 450 is illustrated within the zoom-frame 502. In FIG. 5, an enlarged view of cam handle 286 attached to exterior surface of a side wall of sled enclosure 101 is illustrated within zoom-frame 503.

As illustrated, engagement members 462 extend farther, laterally toward the center of sled enclosure 101, than attachment members 410 extend. In the example shown, attachment member 410 does not extend through left ISR 450. Rather, attachment member 410 extends from the internal surface of left side wall 408 of sled enclosure 101 through first alignment notch 420a, namely, through the thickness of the left side wall 422 of mounting tray 302. Expansion-board components can occupy space beyond the front-end 504 of left ISR 450, without colliding with the attachment member 410 within first alignment notch 420a. In comparison, engagement members 462 identically extend from the internal surface of left side wall 408 of sled enclosure 101 and through the thickness of the left side wall 422 of mounting tray 302, and further extends through the thickness of left ISR 450.

Each engagement member 462 serves as an engagement point when the engagement member 462 is engaged within an engagement notch 326 (FIG. 3) of a corresponding side wall 306, 422 of mounting tray 302 (FIG. 3). When cam mounting mechanism 180 is engaged with sled enclosure 101, rotation of cam handle 286 drives both ISRs 450 and 904 to concurrently perform a linear movement, while maintaining parallel orientation to each other.

As cam handle 286 rotates towards the locked position (i.e., its minimum closed angle), ISRs 450 and 904 push against the seven (7) engagement members 462, which generates a downward vertical force with mechanical advantage to mounting tray 302, based on the shape of guide slots

460. The downward vertical force is applied to mounting tray 302 and is evenly distributed among the seven (7) engagement points (i.e., engagement members 462) to generate a steady and even movement of components of cam mounting mechanism 180.

Guide slot 460 includes a z-shaped recessed lip 506, which is recessed from the internal surface of left ISR 450, enabling the head 468 of an engagement member 462 (e.g., T-nut) to fit within the recessed lip 506. The recessed lip 506 enables the head 468 of an engagement member 462 to be flush with, instead of extending beyond, the internal surface of left ISR 450.

Figure 6:
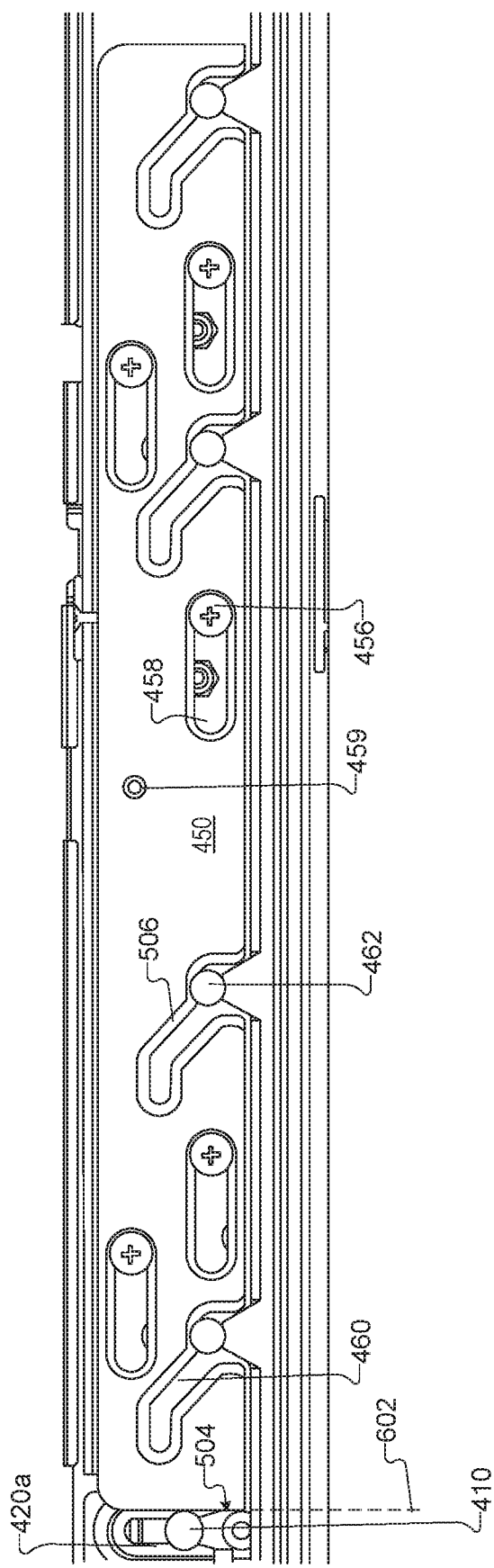
FIG. 6 illustrates an enlarged view of an internal sliding rail in the initial position, according to one embodiment.

FIG. 6 illustrates an enlarged view of an internal sliding rail in the initial position, similar to the position in FIG. 5. That is, FIG. 6 shows an enlarged view of left ISR 450 at its initial position within the cam mounting mechanism 180, which is engaged with the sled enclosure 101 of the IHS 200 of FIG. 2A. Components of IHS 200 shown in FIG. 6 are in the same position as components of IHS 200 shown in FIG. 5. A line 602 indicates the location of the front-end 504 of left ISR 450 when at its initial position. In the illustration, engagement members 462 have been inserted through the open bottom of guide slots 460, and the heads 468 (FIG. 4B) of engagement members 462 are in physical contact with z-shaped recessed lips 506 of guide slots 460. Fasteners 456 are constrained within slide slots 458. Fasteners 456 are in physical contact with the rear-end of a corresponding slide slot 458 when the corresponding ISR 450, 904 is at the initial position.

Figure 7A:
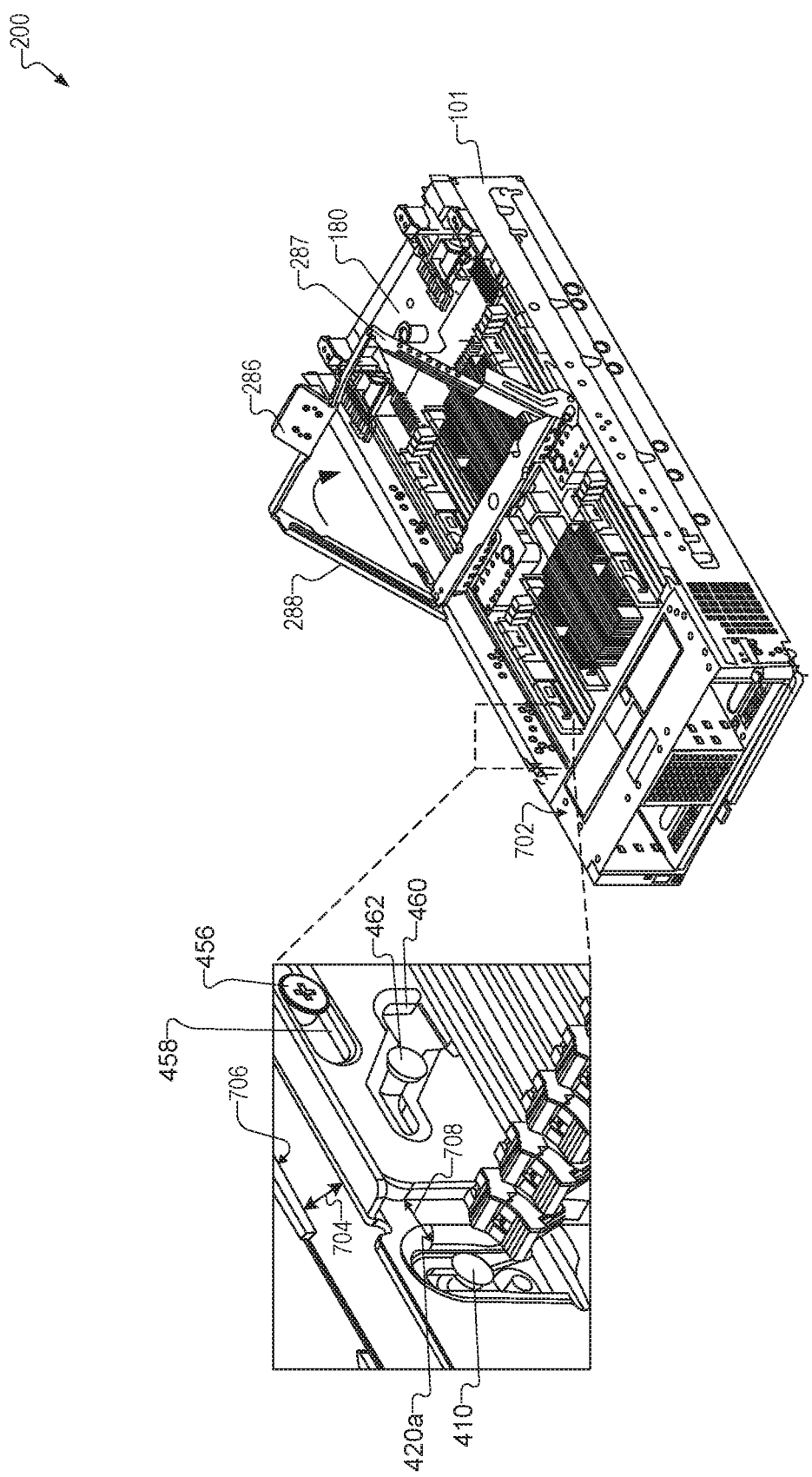
FIG. 7A illustrates the cam mounting mechanism that is mated with the sled enclosure of the information handling system of FIG. 2A, with the cam handle partially descended between the unlocked position and the locked position and the internal sliding rail positioned between the initial position and the final position, according to one embodiment.

FIG. 7A illustrates cam mounting mechanism 180 mated with sled enclosure 101 of information handling system 200 of FIG. 2A, with cam handle 286 partially descended between the unlocked position and the locked position and the internal sliding rail positioned between the initial position and the final position.

Figure 8A:
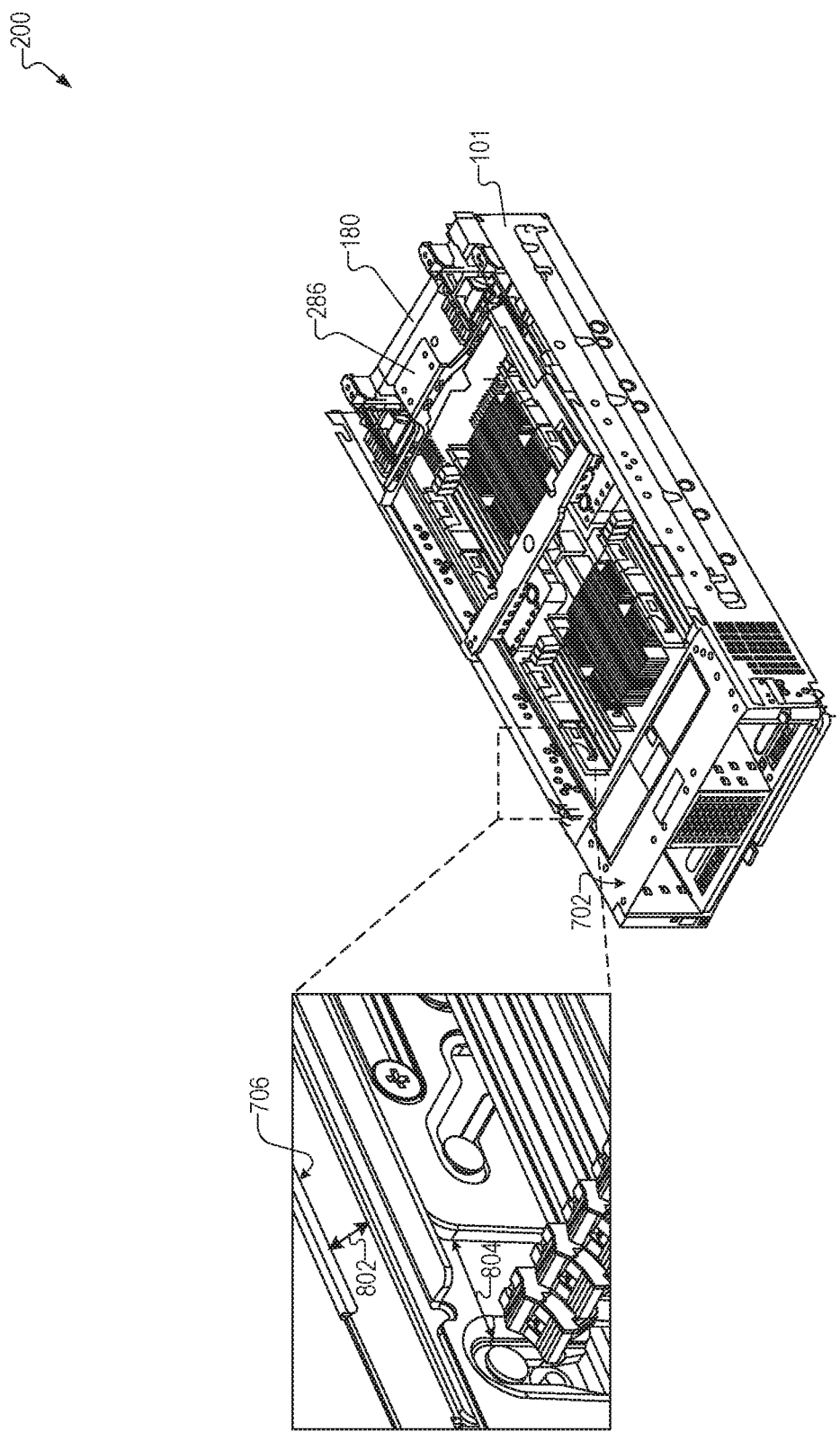
FIG. 8A illustrates the cam mounting mechanism within the sled enclosure of the information handling system of FIG. 2A, with the cam handle in the locked position and the internal sliding rail at the final position, according to one or more embodiments.

Cam handle 286 has rotated in the clockwise direction, to an intermediate position between the unlocked position (FIG. 5) and the locked position (FIG. 8A). When cam handle 286 is at the intermediate position, the angle of cam handle 286, which is formed between the horizontal plane of the top surface 702 of sled enclosure 101 and each of the right and left arm frame-portions 287 and 288, is less than the maximum opening angle (shown in FIGS. 2C-5) and greater than minimum closed angle (shown in FIG. 8A).

Rotation of cam handle 286 in the clockwise direction has driven mounting tray 302 vertically downward relative to sled enclosure 101. Particularly, mounting tray 302 has moved vertically downward by a distance 704, away from the internal surface 706 of a top lip of sled enclosure 101. Each alignment notch 420 has moved vertically downward by the distance 704, relative to corresponding attachment member 410. Each guide slot 460 has moved vertically downward by the distance 704, relative to stationary corresponding engagement member 462. That is, the manual force that hand 290 (FIG. 2) of the technician has applied to cam handle 286 drives guide slot 460 into physical contact with corresponding engagement member 462, such that an interior wall of the z-shaped guide slot 460 forces engagement member 462 to slide into the diagonal portion of guide slot 460.

In unison with rotation of cam handle 286 in the clockwise direction, left and right ISRs 450 and 904 have been driven longitudinally backward (i.e., toward rear-end 414 of mounting tray 302) relative to mounting tray 302. Particularly, left ISR 450 has moved longitudinally backward by a distance 708, away from first alignment notch 420a. Each guide slot 460 has moved longitudinally backward by distance 708, relative to the attachment member 410 within first alignment notch 420a. Each slide slot 458 has moved longitudinally backward by the distance 708, relative to the stationary corresponding fastener 456 within the slide slot 458.

Figure 7B:
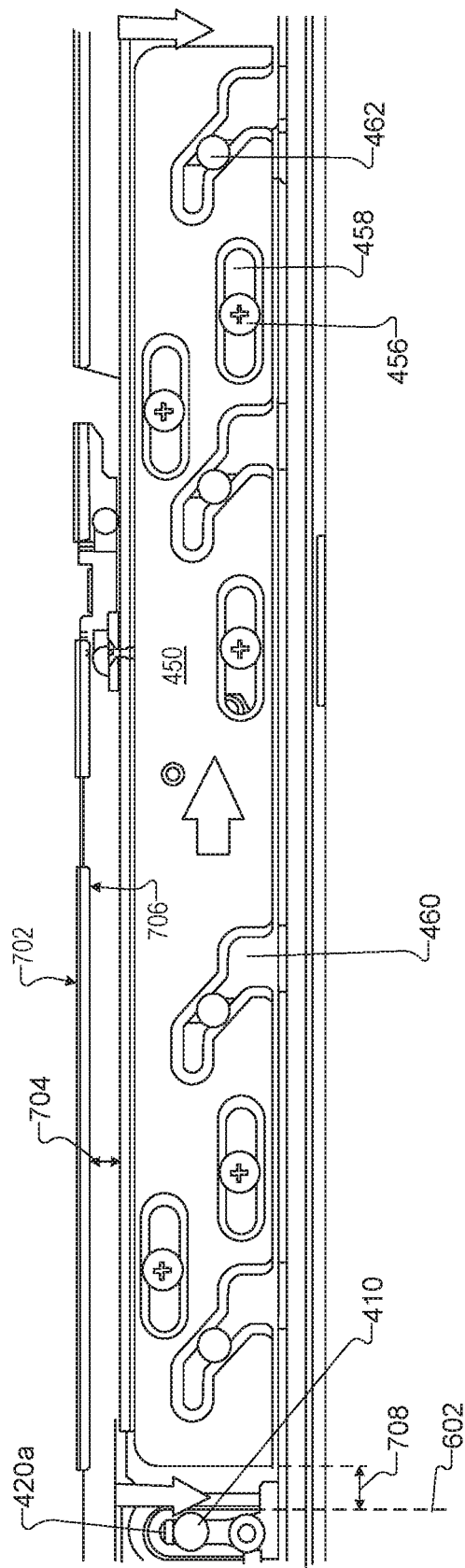
FIG. 7B illustrates an enlarged view of an internal sliding rail positioned between the initial position and the final position, similar to FIG. 7A, according to one embodiment.

FIG. 7B illustrates an enlarged view of the internal sliding rail positioned between the initial position and the final position, similar to the position in FIG. 7A. That is, FIG. 7B shows an enlarged view of left ISR 450 at the intermediate position between its initial and final positions within cam mounting mechanism 180, which is engaged with the sled enclosure 101 of the IHS 200 of FIG. 2A. Components of IHS 200 shown in FIG. 7B are in the same position as components of IHS 200 shown in FIG. 7A.

FIG. 8A illustrates cam mounting mechanism 180 locked within sled enclosure 101 of information handling system 200 of FIG. 2A, with the cam handle 286 in the locked position and the internal sliding rail at the final position. In FIG. 8A, cam handle 286 has further rotated in the clockwise direction from the position shown in FIG. 7A, to the locked position. The angle of cam handle 286 is formed between the horizontal plane of the top surface 702 of sled enclosure 101 and each of the right and left frame-portions 287 and 288. When cam handle 286 is at the locked position, the angle of cam handle 286 is the minimum closed angle. In some embodiments, the minimum closed angle is a zero-degree (0°) angle.

Further rotation of cam handle 286 (from the FIG. 7A position) in the clockwise direction has driven mounting tray 302 vertically downward relative to sled enclosure 101. Mounting tray 302 has moved vertically downward into its seated position, in which exposed connectors 184 of expansion board 182 are fully mated with internal connectors 136 of system board 103. Particularly, mounting tray 302 has moved vertically downward by a total distance 802, away from the internal surface 706 of the top lip of sled enclosure 101. Each alignment notch 420 has moved vertically downward by the distance 802, relative to corresponding attachment member 410. Each guide slot 460 has moved vertically downward by the distance 802, relative to stationary corresponding engagement member 462. When attachment member 410 reaches the top of the diagonal portion of guide slot 460, the attachment member 410 slides into a horizontal (i.e., in the longitudinal direction) portion of the z-shaped guide slot 460. The horizontal portion of guide slot 460 forces ISR 450 to slide in the longitudinal only direction, relative to stationary engagement member 462.

In unison, based on further rotation (from FIG. 7A position) of cam handle 286 in the clockwise direction, left and right ISRs 450 and 904 have been further driven longitudinally backward relative to mounting tray 302. Particularly, left ISR 450 has moved longitudinally backward by a next total distance 804, away from first alignment notch 420a. Each guide slot 460 has moved longitudinally backward by the distance 804, relative to the attachment member 410 within first alignment notch 420a. Each slide slot 458 has moved longitudinally backward by the distance 804, relative to the stationary corresponding fastener 456 within the slide slot 458.

Figure 8B:
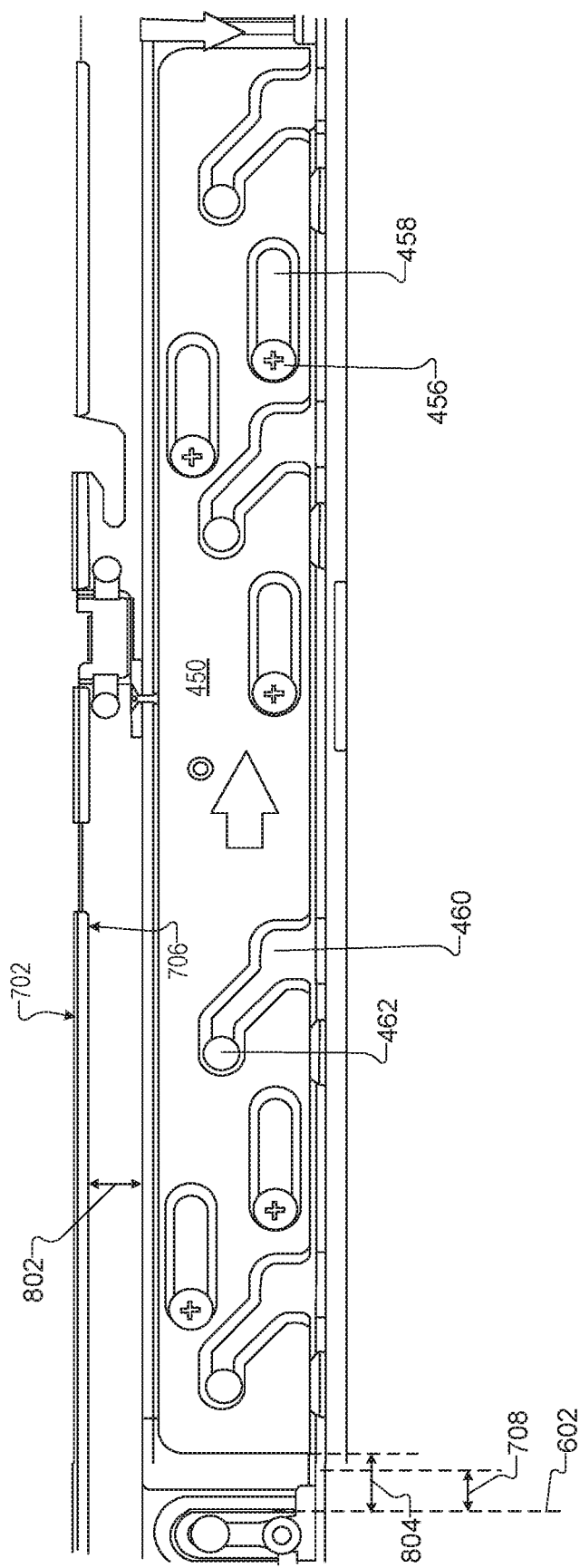
FIG. 8B illustrates an enlarged view of an internal sliding rail in the final position, according to one embodiment.

FIG. 8B illustrates an enlarged view of the internal sliding rail in the final position, similar to the position in FIG. 8A. That is, FIG. 8B shows an enlarged view of left ISR 450 at the final position within the cam mounting mechanism 180, which is engaged with sled enclosure 101 of IHS 200 of FIG. 2A. Components of IHS 200 shown in FIG. 8B are in the same position as components of IHS 200 shown in FIG. 8A.

Figure 9A:
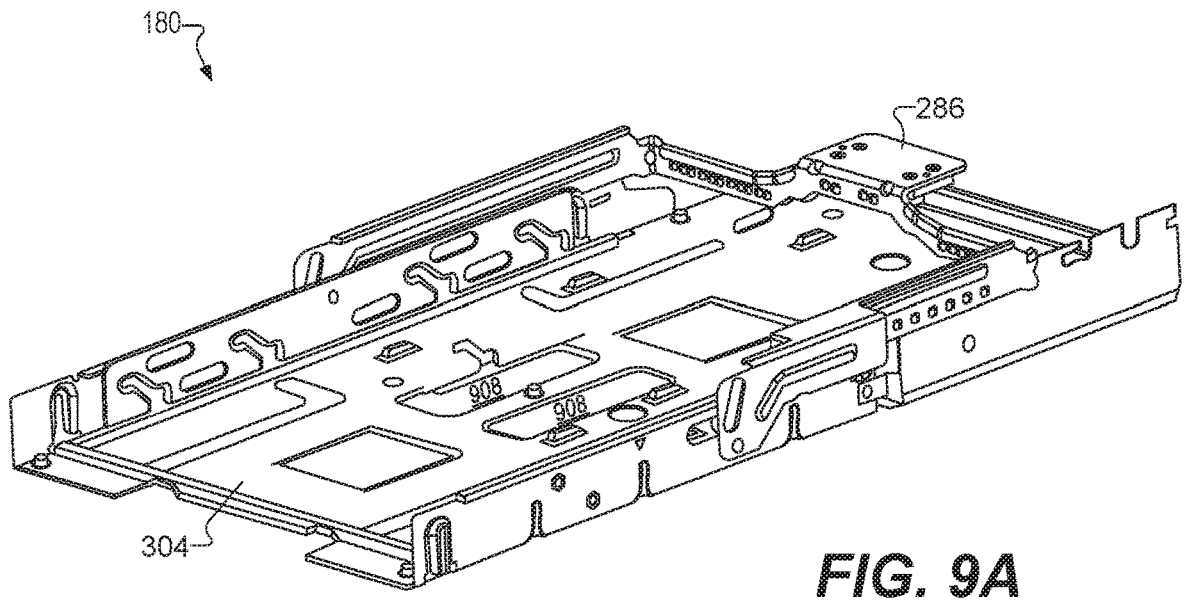
FIG. 9A illustrates an assembly view of a cam mounting mechanism, according to one or more embodiments of this disclosure.
Figure 9B:
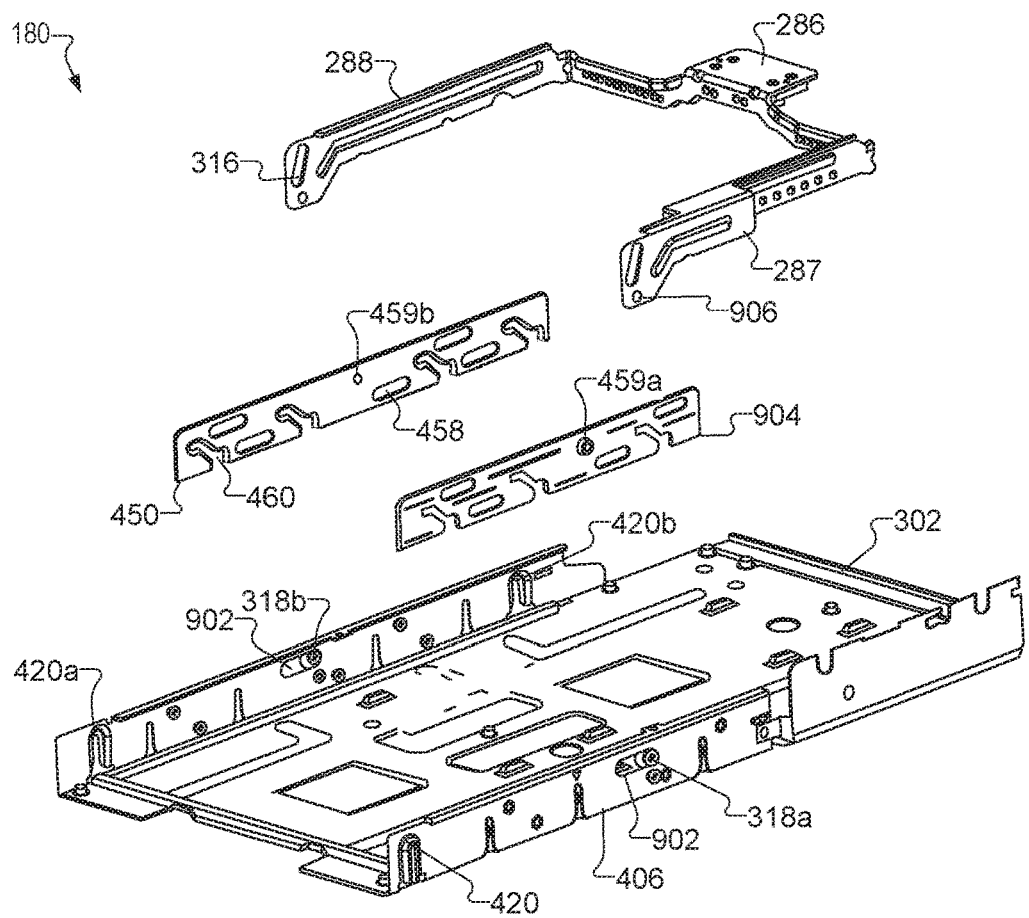
FIG. 9B illustrates an exploded view of the cam mounting mechanism of FIG. 9A, according to one or more embodiments of this disclosure.

FIG. 9A illustrates an assembly view of a cam mounting mechanism, according to one or more embodiments of this disclosure. FIG. 9B illustrates an exploded view of the cam mounting mechanism of FIG. 9A, according to one or more embodiments of this disclosure. In FIGS. 9A and 9B, cam handle 286 is in the locked position.

In FIGS. 9A-9B, horizontal-drive slot 902 enables mounting tray 302 to remain stationary relative to cam handle 286 while cam handle 286 rotates between its locked and unlocked positions. More particularly, the angular motion of cam handle 286 rotating between its locked and unlocked positions includes a component of longitudinal motion. This component of longitudinal motion transfers from cam handle 286 to both ISRs 450 and 904 through a rigid fastener 318*a*, 318*b* that binds drive slot 316 of cam handle 286 to both ISRs 450 and 904. This component of longitudinal motion does not transfer to mounting tray 302 because horizontal-drive slot 902 allows fastener 318*a*, 318*b* to move in the longitudinal direction without fastener 318*a*, 318*b* being rigidly attached to the corresponding sidewall 306, 422 of mounting tray 302.

Each pivot anchor 314 extends through a corresponding pivot anchor hole 906 of cam handle 286 in order to attach each of the right and left frame-portions 287 and 288 to the external surface of the corresponding sidewall 306, 422 of mounting tray 302. Connector openings 908 in the base 304 of mounting tray 302 enable exposed connectors 184 to extend through the base 304 and blind-mate with internal connectors 136 (shown in FIG. 4A).

Figure 10:
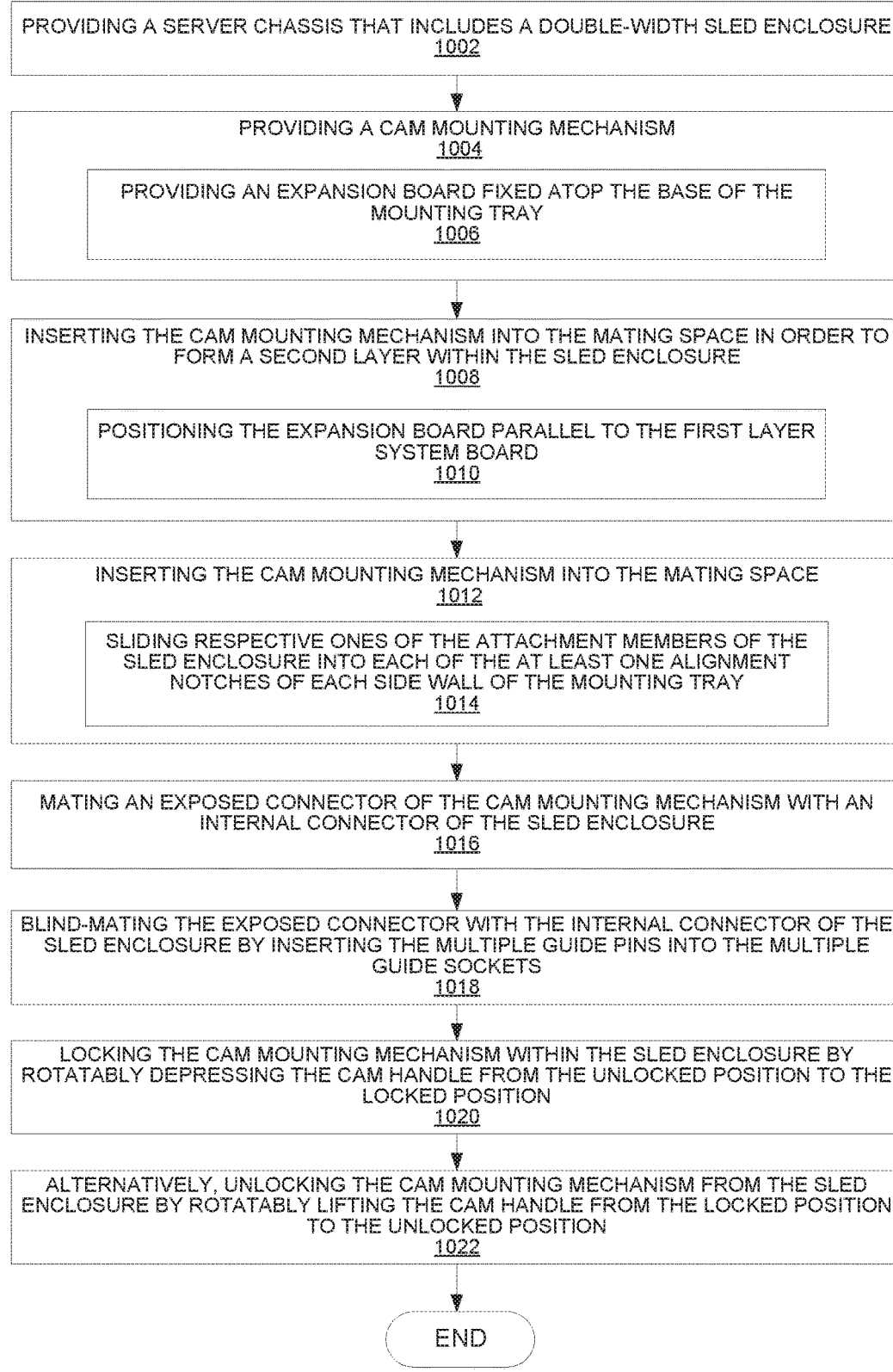
FIG. 10 illustrates a method for provisioning an IHS with a cam mounting mechanism configured as described herein, according to one or more embodiments of this disclosure.

FIG. 10 illustrates a flowchart of a method 1000 for provisioning IHS with a cam mounting mechanism 180, and within which various aspects of the disclosure are implemented, according to one or more embodiments of this disclosure. The provisioning can be completed by an automation/manufacturing system that is controlled by one or more automation IHSs. In one embodiment, method 1000 includes provisioning (e.g., manufacturing) a cam mounting mechanism 180 and a sled enclosure 101 (as shown in FIGS. 2A-9B) of IHS 100, 200 (as shown in FIGS. 1-2A).

At block 1002, method 1000 includes providing a server chassis that includes a double-layer sled enclosure 101. The sled enclosure 101, according to embodiments of the present disclosure, includes various components. The sled enclosure 101 can be a sever chassis that houses one or more server components, such as internal components of an IHS 100, 200. At block 1004, the method 1000 includes providing a cam mounting mechanism 180. The cam mounting mechanism 180, according to embodiments of the present disclosure, includes a detachable mounting tray 302, two ISRs 450 and 904, and cam handle 286. As an example, block 1004 could include providing (at block 1006) the cam mounting mechanism 180 by providing an expansion board 182 fixed atop the base 304 of the mounting tray 302. At block 1008, the method 1000 includes inserting cam mounting mechanism 180 into the mating space in order to form a second layer within the sled enclosure 101. For example, block 1008 could include positioning (at block 1010) the expansion board 182 parallel to a first layer system board 103. At block 1012, the method 1000 includes inserting the cam mounting mechanism 180 into the mating space within the sled enclosure 101. For example, block 1012 could include sliding (at block 1014) respective ones of the attachment members 410 of the sled enclosure 101 into each of the at least one alignment notches 420 of each side wall 306, 422 of the mounting tray 302. At block 1016, the method 1000 includes mating an exposed connector 184 of the cam mounting mechanism 180 with an internal connector 136 of the sled enclosure 101. Alternative to or in addition to block 1016, at block 1018, method 1000 includes blind-mating the exposed connector 184 with the internal connector 136 of the sled enclosure 101 by inserting the multiple guide pins 322 into the multiple guide sockets 402. At block 1020, method 1000 includes locking the cam mounting mechanism 180 within the sled enclosure 101 by rotatably depressing the cam handle 286 from the unlocked position to the locked position. At block 1022, method 1000 includes, alternatively, unlocking the cam mounting mechanism 180 from the sled enclosure 101 by rotatably lifting the cam handle 286 from the locked position to the unlocked position.

Figure 11:
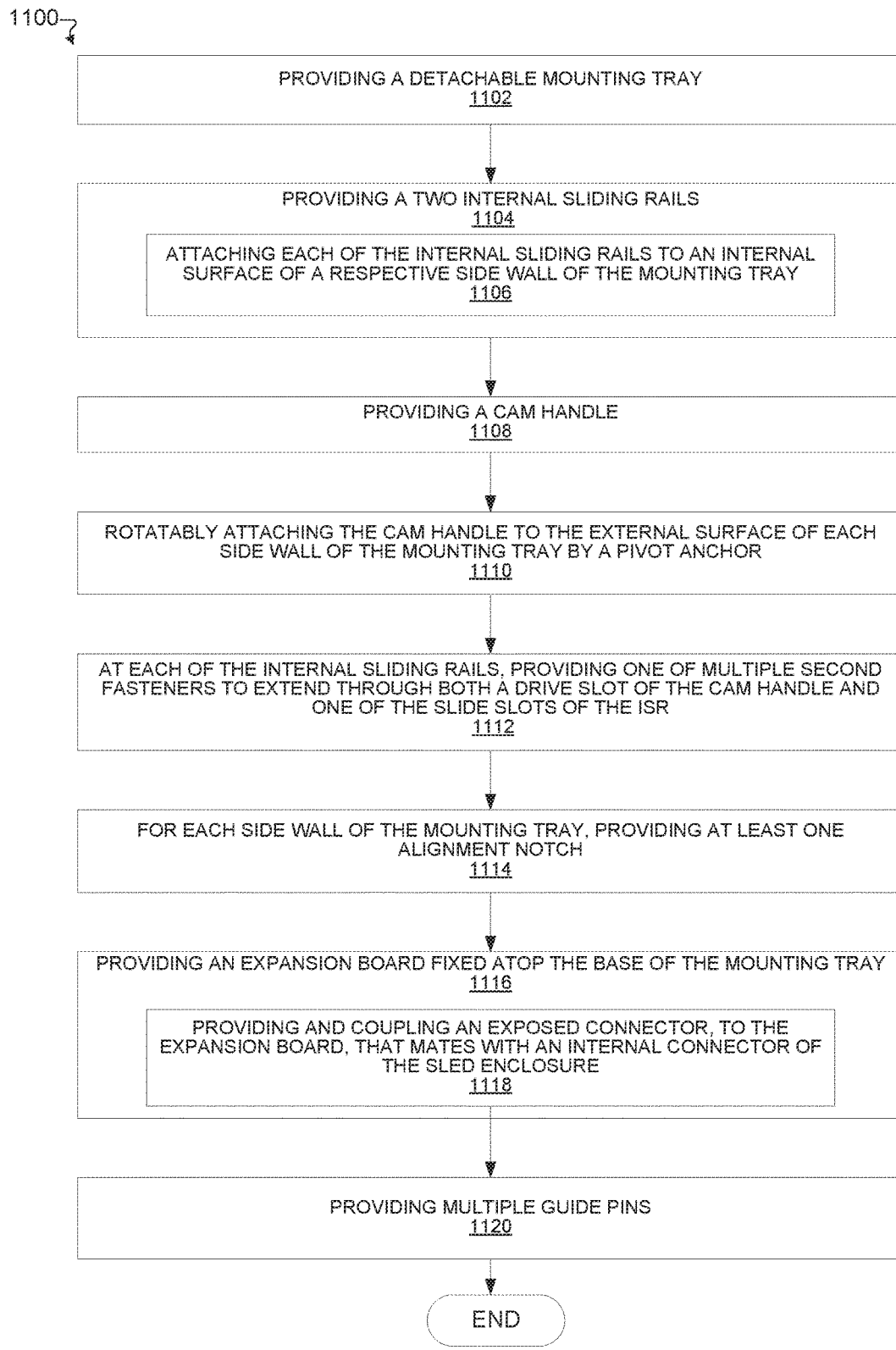
FIG. 11 illustrates a method for provisioning a cam mounting mechanism configured as described herein, for use within an IHS, according to one or more embodiments of this disclosure.

FIG. 11 illustrates flowchart of a method 1100 for provisioning a cam mounting mechanism 180 configured as described herein, for use within an IHS 200, according to one or more embodiments of this disclosure. The provisioning can be completed by an automation/manufacturing system that is controlled by one or more automation IHSs. Method 1100 can be performed as a subprocess of method 1000 of FIG. 10, or can be performed as a stand-alone, independent process.

At block 1102, method 1100 includes providing a detachable mounting tray 302 that includes a base and two side walls extending upward from the base. More particularly, providing the detachable mounting tray 302 includes providing at least one engagement notch 326 in each side wall of the detachable mounting tray 302, where each engagement notch 326 is positioned to slidably receive a respective engagement member 462 of a sled enclosure 101.

At block 1104, method 1100 includes providing two ISRs 450 and 904 that slide between an initial position closest to a front-end of the base and a final position closest to a rear-end of the base. More particularly, providing the two ISRs 450 and 904 includes providing at least one slide slot 458 and at least two guide slots 460 through each of the ISRs. More particularly, providing two ISRs 450 and 904 includes positioning each guide slot 460 to slidably receive a respective one of the engagement members of the sled enclosure, and shaping each guide slot 460 to constrain movement of the mounting tray to a vertical direction relative to the sled enclosure while constraining movement of the ISR to the longitudinal direction relative to the engagement members of the sled enclosure. As an example, at block 1104, providing two ISRs 450 and 904 can include attaching (at block 1106) each of the ISRs 450 and 904 to an internal surface of a respective side wall of the mounting tray 302 by a respective fastener 458 that extends through a respective slide slot of the ISR.

At block 1108, method 1100 includes providing a cam handle 286 that is rotatably attached to an external surface of each side wall of the mounting tray 302 and that, when depressed, rotates from an unlocked position to a locked position in order to drive both ISRs to move in unison from the initial position to the final position. At block 1110, method 1100 includes rotatably attaching the cam handle to the external surface of each side wall of the mounting tray by a pivot anchor.

At block 1112, method 1100 includes, at each of the ISRs 450 and 904, providing one of multiple second fasteners 318 to extend through both a drive slot 316 of the cam handle 286 and one of the slide slots of the ISR in order for angular actuation of the cam handle 286 to drive the two ISRs 450 and 904 to move in unison with the cam handle 286.

At block 1114, method 1100 includes, for each side wall of the mounting tray 302, providing at least one alignment notch positioned to slidably receive an attachment member of the sled enclosure in order to align the front-end and rear-end of the base of the mounting tray with a front-end and rear-end of a mating space of the sled enclosure and to align external surfaces of the side walls of the mounting tray within internal surfaces of side walls of the sled enclosure.

At block 1116, method 1100 includes providing an expansion board 182 and affixing the expansion board 182 atop the base 304 of the mounting tray 302. As an example, at block 1006, providing the expansion board can include providing and coupling (at block 1118) one or more expansion-board server components to the expansion board 182, wherein the expansion-board server components include an exposed connector that mates with an internal connector of the sled enclosure.

At block 1120, method 1100 includes, providing multiple guide pins that extend downward from a bottom surface of the base of the mounting tray 302, beyond a bottom surface of the exposed connector that extends below the bottom surface of the mounting tray. More particularly, at block 1120, providing multiple guide pins includes positioning each guide pin to insert into a respective guide socket of the sled enclosure in order for the exposed connector to blind-mate with the internal connector of the sled enclosure.

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object-oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

Where utilized herein, the terms "tangible" and "non-transitory" are intended to describe a computer-readable storage medium (or "memory") excluding propagating electromagnetic signals; but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

While the disclosure has been described with reference to embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A cam mounting mechanism comprising:
    a detachable mounting tray that includes a base and two side walls extending upward from the base, each side wall including at least one engagement notch, each engagement notch positioned to slidably receive a respective engagement member of a sled enclosure of a server chassis;
    two internal sliding rails that slide between an initial position closest to a front-end of the base and a final position closest to a rear-end of the base, each internal sliding rail being attached to an internal surface of a respective side wall of the mounting tray by a respective fastener that extends through a respective slide slot of the internal sliding rail, and each internal sliding rail including the respective slide slots and at least two guide slots,
        each slide slot enabling the internal sliding rail to slide in a longitudinal direction relative to the side wall, and
        each guide slot being positioned to slidably receive a respective one of the engagement members of the sled enclosure and being shaped to constrain movement of the mounting tray to a vertical direction relative to the sled enclosure while constraining movement of the internal sliding rail to the longitudinal direction relative to the engagement members of the sled enclosure; and
    a cam handle that is rotatably attached to an external surface of each side wall of the mounting tray and that, when depressed, rotates from an unlocked position to a locked position in order to drive both internal sliding rails to move in unison from the initial position to the final position;
    wherein at each of the internal sliding rails, one of multiple second fasteners extends through both a drive slot of the cam handle and one of the slide slots of the internal sliding rail, in order for angular actuation of the cam handle to drive the internal sliding rails to move in unison with the cam handle.

2. The cam mounting mechanism of claim 1, wherein each side wall of the mounting tray includes at least one alignment notch positioned to slidably receive an attachment member of the sled enclosure in order to align the front-end and rear-end of the base of the mounting tray with a front-end and rear-end of a mating space of the sled enclosure and to align external surfaces of the side walls of the mounting tray within internal surfaces of side walls of the sled enclosure.

3. The cam mounting mechanism of claim 1, further comprising an expansion board fixed atop the base of the mounting tray, the expansion board including one or more expansion-board server components.

4. The cam mounting mechanism of claim 3, wherein the one or more expansion-board server components comprises an exposed connector that mates with an internal connector of the sled enclosure.

5. The cam mounting mechanism of claim 4, further comprising multiple guide pins that extend downward from a bottom surface of the base, beyond a bottom surface of the exposed connector that extends below the bottom surface of the mounting tray, each guide pin being positioned to insert into a respective guide socket of the sled enclosure in order for the exposed connector to blind-mate with the internal connector of the sled enclosure.

6. The cam mounting mechanism of claim 1, wherein:
    the cam handle is rotatably attached to the external surface of each side wall of the mounting tray by a pivot anchor.

7. The cam mounting mechanism of claim 1, wherein each guide slot has a z-shape.

8. The cam mounting mechanism of claim 1, the cam handle being located at the center of mass of the cam mounting mechanism such that a weight of the mounting tray is balanced laterally and longitudinally to prevent tilting of the cam mounting mechanism.

9. An Information Handling System (IHS) comprising:
    a server chassis having a sled enclosure;
    a cam mounting mechanism that includes:
        a detachable mounting tray that includes a base and two side walls extending upward from the base, each side wall includes at least one engagement notch, each engagement notch positioned to slidably receive a respective engagement member of the sled enclosure of the server chassis;
        two internal sliding rails that slide between an initial position closest to a front-end of the base and a final position closest to a rear-end of the base, each internal sliding rail being attached to an internal surface of a respective side wall of the mounting tray by a respective fastener that extends through a respective slide slot of the internal sliding rail, and each internal sliding rail including the respective slide slots and at least two guide slots,
            each slide slot enabling the internal sliding rail to slide in a longitudinal direction relative to the side wall, and
            each guide slot being positioned to slidably receive a respective one of the engagement members of the sled enclosure and being shaped to constrain movement of the mounting tray to a vertical direction relative to the sled enclosure while constraining movement of the internal sliding rail to the longitudinal direction relative to the engagement members of the sled enclosure;

a cam handle that is rotatably attached to an external surface of each side wall of the mounting tray and that, when depressed, rotates from an unlocked position to a locked position in order to drive both internal sliding rails to move in unison from the initial position to the final position; and multiple guide pins that extend downward from a bottom surface of the base of the cam mounting mechanism, beyond a bottom surface of the exposed connector that extends below the bottom surface of the base of the mounting tray, each guide pin being positioned to insert into a respective guide socket of the sled enclosure in order for the exposed connector to blind-mate with the internal connector of the sled enclosure; and an expansion board fixed atop the base of the mounting tray, the expansion board including one or more expansion-board server components.

10. The IHS of claim 9, wherein the sled enclosure comprises:

a double-layer sled enclosure, the sled enclosure housing a first layer system board and one or more system-board server components arranged to form a mating space that receives the cam mounting mechanism with the expansion board, forming a second layer within the sled enclosure, the expansion board being positioned parallel to the first layer system board.

11. The IHS of claim 10, wherein:

the sled enclosure further comprises a base, two side walls extending upward from the base, and at least two attachment members fixed to an internal surface of each side wall of the sled enclosure proximate a front-end and rear-end of the mating space; and each side wall of the mounting tray includes at least one alignment notch positioned to slidably receive a respective one of the attachment members of the sled enclosure in order to align the front-end and rear-end of the base of the mounting tray with the front-end and the rear-end of the mating space of the sled enclosure and to align the external surfaces of the side walls of the mounting tray within the internal surfaces of side walls of the sled enclosure.

12. The IHS of claim 10, wherein:

the cam mounting mechanism further comprises an exposed connector that mates with an internal connector of the sled enclosure; and the one or more expansion-board server components communicably couple to the one or more system-board server components, when the exposed connector is mated with the internal connector.

13. The IHS of claim 9, wherein:

the cam handle is rotatably attached to the external surface of each side wall of the mounting tray by a pivot anchor; and at each of the internal sliding rails, one of multiple second fasteners extends through both a drive slot of the cam handle and one of the slide slots of the internal sliding rail, in order for angular actuation of the cam handle to drive the internal sliding rails to move in unison with the cam handle.

14. A method for provisioning a cam mounting mechanism for use within an Information Handling System (IHS), the method comprising:

providing a detachable mounting tray that includes a base and two side walls extending upward from the base, wherein each side wall includes at least one engagement notch, and each engagement notch is positioned to slidably receive a respective engagement member of a sled enclosure;

providing two internal sliding rails that slide between an initial position closest to a front-end of the base and a final position closest to a rear-end of the base, each internal sliding rail being attached to an internal surface of a respective side wall of the mounting tray by a respective fastener that extends through a respective slide slot of the internal sliding rail, and wherein each internal sliding rail includes the respective slide slots and at least two guide slots, wherein each slide slot enables the internal sliding rail to slide in a longitudinal direction relative to the side wall, and wherein each guide slot is positioned to slidably receive a respective one of the engagement members of the sled enclosure and being shaped to constrain movement of the mounting tray to a vertical direction relative to the sled enclosure while constraining movement of the internal sliding rail to the longitudinal direction relative to the engagement members of the sled enclosure; and providing a cam handle that is rotatably attached to an external surface of each side wall of the mounting tray and that, when depressed, rotates from an unlocked position to a locked position in order to drive both internal sliding rails to move in unison from the initial position to the final position, wherein at each of the internal sliding rails, one of multiple second fasteners extends through both a drive slot of the cam handle and one of the slide slots of the internal sliding rail, in order for angular actuation of the cam handle to drive the internal sliding rails to move in unison with the cam handle.

15. The method of claim 14, wherein each side wall of the mounting tray includes at least one alignment notch positioned to slidably receive an attachment member of the sled enclosure in order to align the front-end and rear-end of the base of the mounting tray with a front-end and rear-end of a mating space of the sled enclosure and to align external surfaces of the side walls of the mounting tray within internal surfaces of side walls of the sled enclosure.

16. The method of claim 14, further comprising provisioning the IHS by:

providing the sled enclosure of the server chassis, the sled enclosure being a double-layer sled enclosure, the sled enclosure housing a first layer system board and one or more system-board server components arranged to form a mating space, wherein the sled enclosure comprises a base, two side walls extending upward from the base, and at least two attachment members fixed to an internal surface of each side wall of the sled enclosure proximate a front-end and rear-end of the mating space, and wherein each side wall of the mounting tray includes at least one alignment notch positioned to slidably receive a respective one of the attachment members of the sled enclosure; and inserting the cam mounting mechanism into the mating space by sliding respective ones of the attachment members of the sled enclosure into each of the at least one alignment notches of each side wall of the mounting tray in order to align the front-end and rear-end of the base of the mounting tray with the front-end and the rear-end of the mating space of the sled enclosure and to align the external surfaces of the side walls of the mounting tray within the internal surfaces of side walls of the sled enclosure.

17. The method of claim 16, further comprising:

providing an expansion board fixed atop the base of the mounting tray, the expansion board including one or more expansion-board server components; and mating an exposed connector of the one or more expansion-board server components with an internal connector of the sled enclosure, wherein in response to mating the exposed connector with the internal connector, the one or more expansion-board server components is communicably coupled to the one or more system-board server components.

18. The method of claim 17, wherein:

the sled enclosure further comprises multiple guide sockets;

the cam mounting mechanism further comprises multiple guide pins that extend downward from a bottom surface of the base of the cam mounting mechanism, beyond a bottom surface of the exposed connector that extends below the bottom surface of the base of the mounting tray each guide pin being positioned to insert into a respective one of the multiple guide sockets of the sled enclosure; and the method further comprising blind-mating the exposed connector with the internal connector of the sled enclosure by inserting the multiple guide pins into the multiple guide sockets.

19. The method of claim 14, wherein:

the cam handle is rotatably attached to the external surface of each side wall of the mounting tray by a pivot anchor.

20. The method of claim 19, further comprising:

locking the cam mounting mechanism within the sled enclosure by rotatably depressing the cam handle from the unlocked position to the locked position; or alternatively, unlocking the cam mounting mechanism from the sled enclosure by rotatably lifting the cam handle from the locked position to the unlocked position.

* * * * *